United States Patent [19]
Yoshitomi et al.

[11] Patent Number: 5,736,767
[45] Date of Patent: Apr. 7, 1998

[54] SEMICONDUCTOR DEVICE INCLUDING A CMOSFET OF A SINGLE-GATE

[75] Inventors: Takashi Yoshitomi, Kamakura; Tatsuya Ohguro, Yokohama, both of Japan

[73] Assignee: Kabushiki Kaisha Toshiba, Kawasaki, Japan

[21] Appl. No.: 675,720

[22] Filed: Jul. 2, 1996

[30] Foreign Application Priority Data

Aug. 9, 1995 [JP] Japan .................. 7-203172
Mar. 18, 1996 [JP] Japan .................. 8-061448

[51] Int. Cl.⁶ ............................................. H01L 29/78
[52] U.S. Cl. .................. 257/344; 257/371; 257/412; 257/413; 257/402; 257/392; 257/388; 257/407
[58] Field of Search ........................ 257/369, 371, 257/412, 413, 402, 392, 388, 403, 404, 336, 344, 407

[56] References Cited

U.S. PATENT DOCUMENTS

| | | | |
|---|---|---|---|
| 5,164,801 | 11/1992 | Hieda et al. | 257/371 |
| 5,329,138 | 7/1994 | Mitani et al. | 257/42 |
| 5,543,356 | 8/1996 | Murakami et al. | 437/152 |

FOREIGN PATENT DOCUMENTS 52-14958  4/1977  Japan.

*Primary Examiner*—Tom Thomas
*Assistant Examiner*—David B. Hardy
*Attorney, Agent, or Firm*—Oblon, Spivak, McClelland, Maier & Neustadt, P.C.

[57] ABSTRACT

A semiconductor device including a CMOSFET having first and second channel type MOSFETs, respectively formed in a first semiconductor region of a first conductivity type and in a second semiconductor region of a second conductivity type. The first channel type MOSFET has a first gate electrode insulatively formed on the first region, made of a first conductivity type semiconductor, and having a gate length of 0.2 μm or less, first source/drain regions of the second conductivity type respectively formed in the first region and having a LDD structure, and a buried channel region of the second conductivity type formed just below the first gate electrode. The second channel type MOSFET has a second gate electrode insulatively formed on the second region, made of a first conductivity type semiconductor, and having a gate length of 0.2 μm or less, second source/drain regions of the first conductivity type respectively formed in the second region and having a LDD structure.

20 Claims, 17 Drawing Sheets

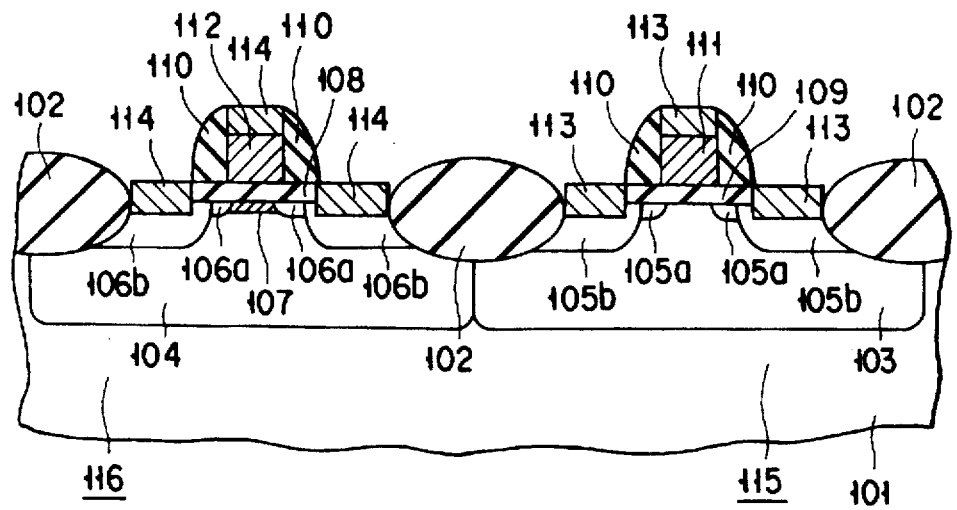
F I G. 1
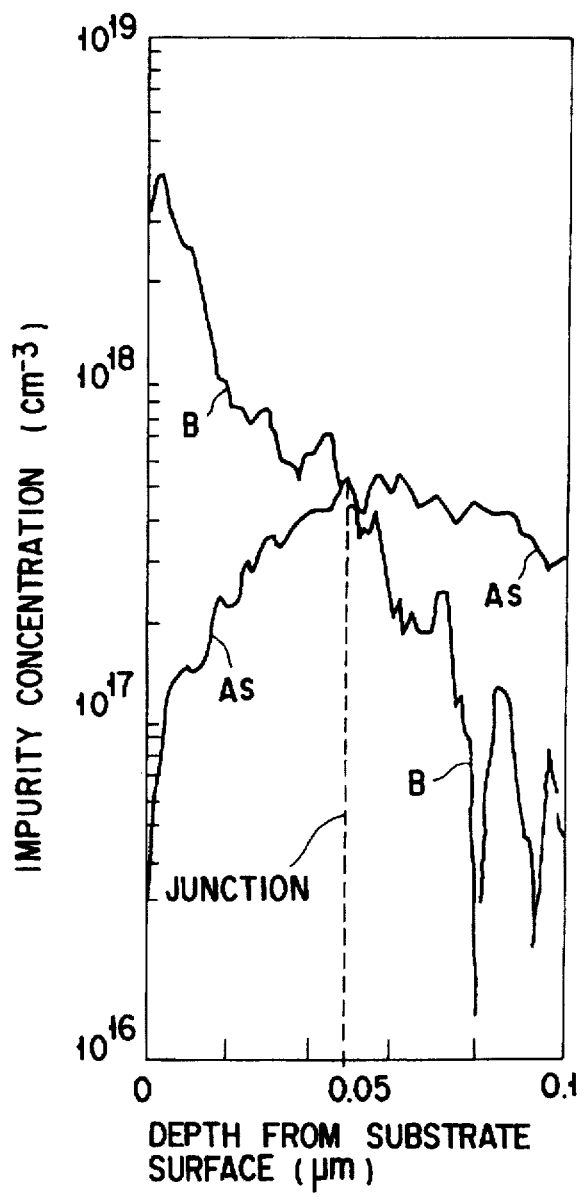
F I G. 2

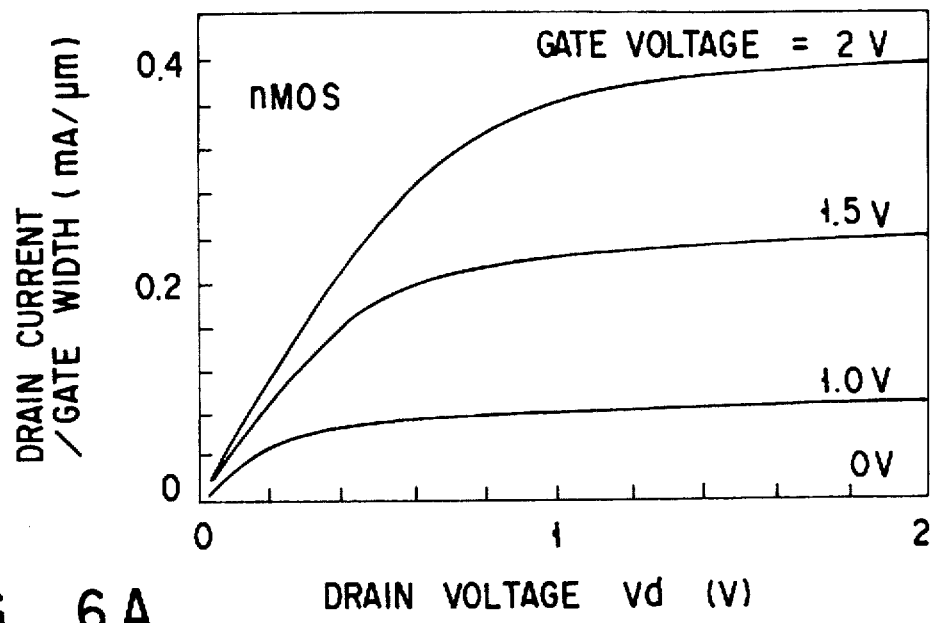
F I G. 6A
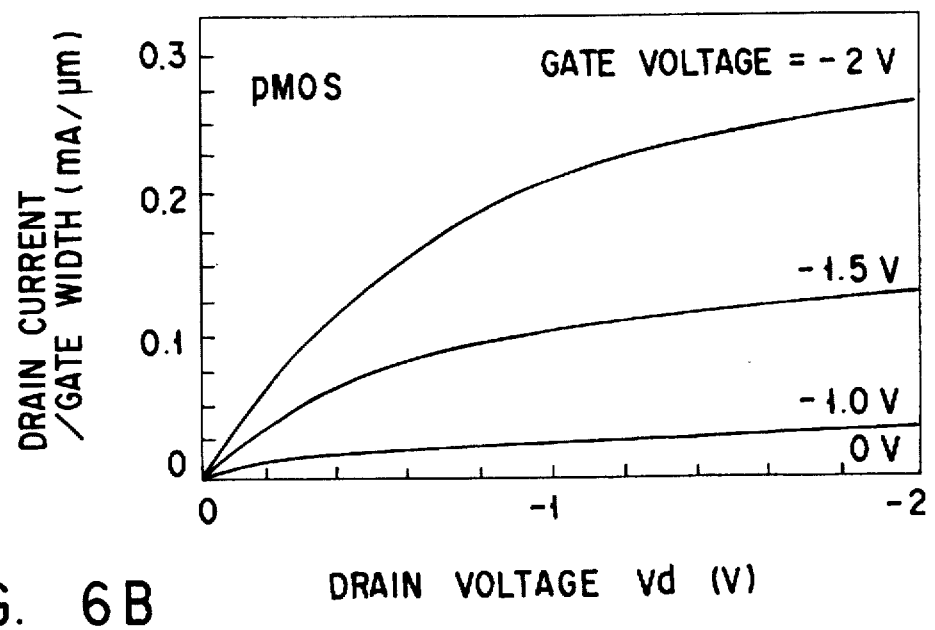
F I G. 6B

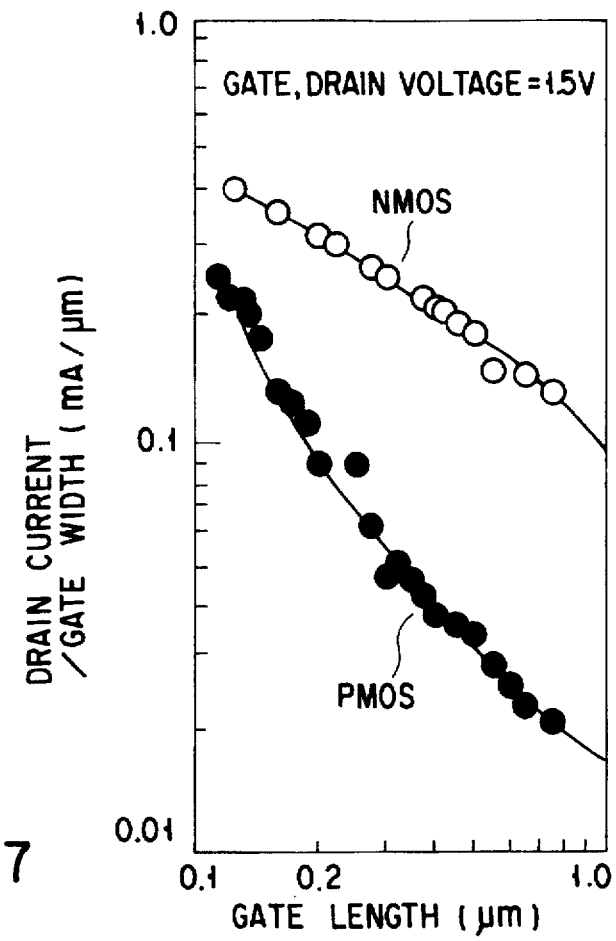
F I G. 7
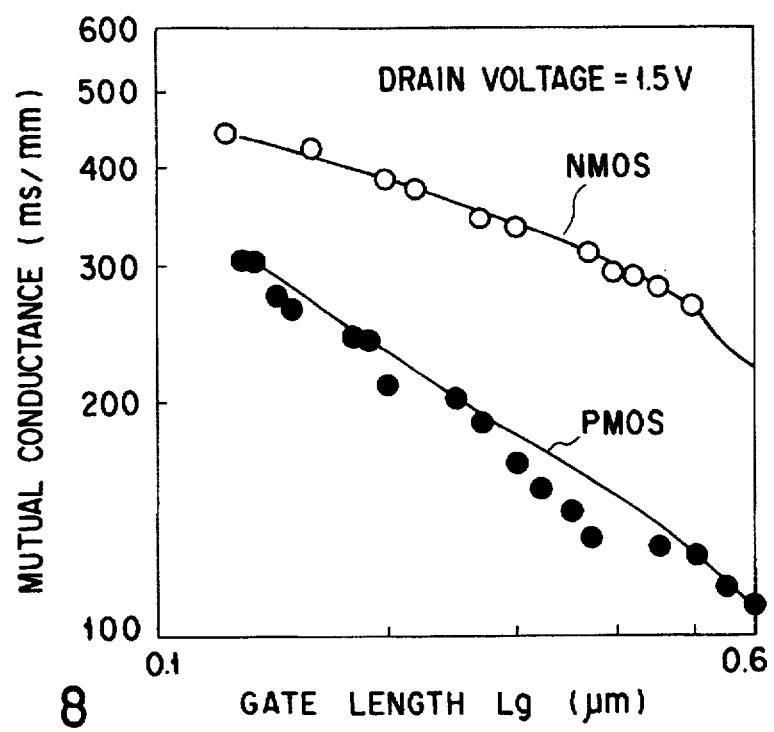
F I G. 8

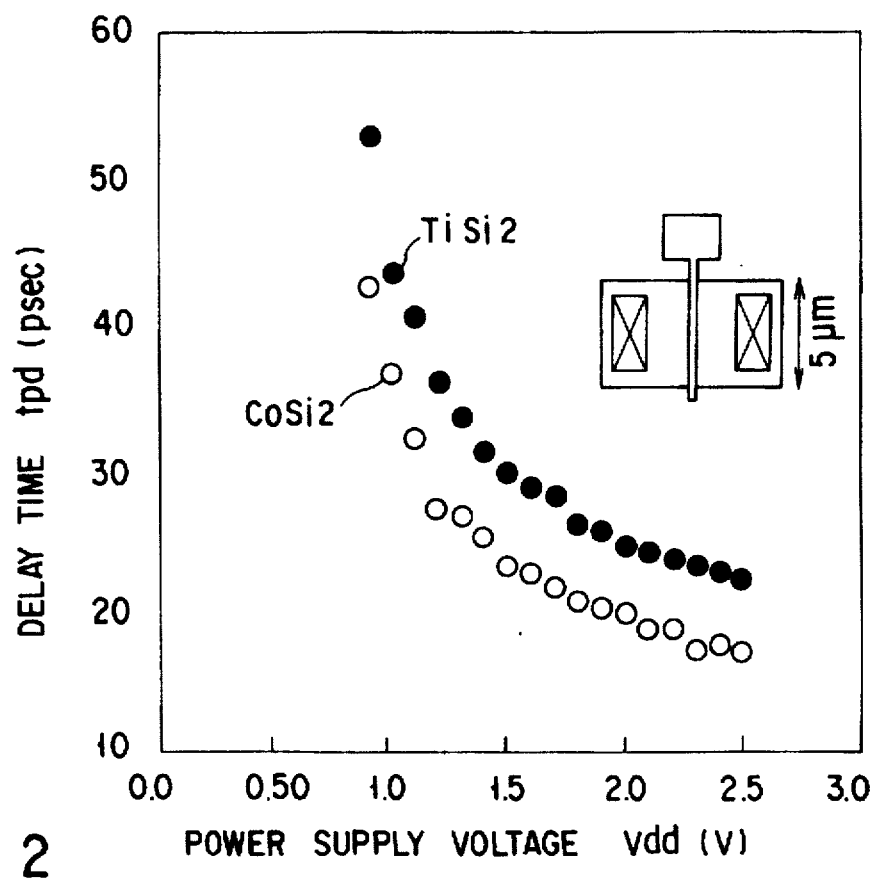
F I G. 12

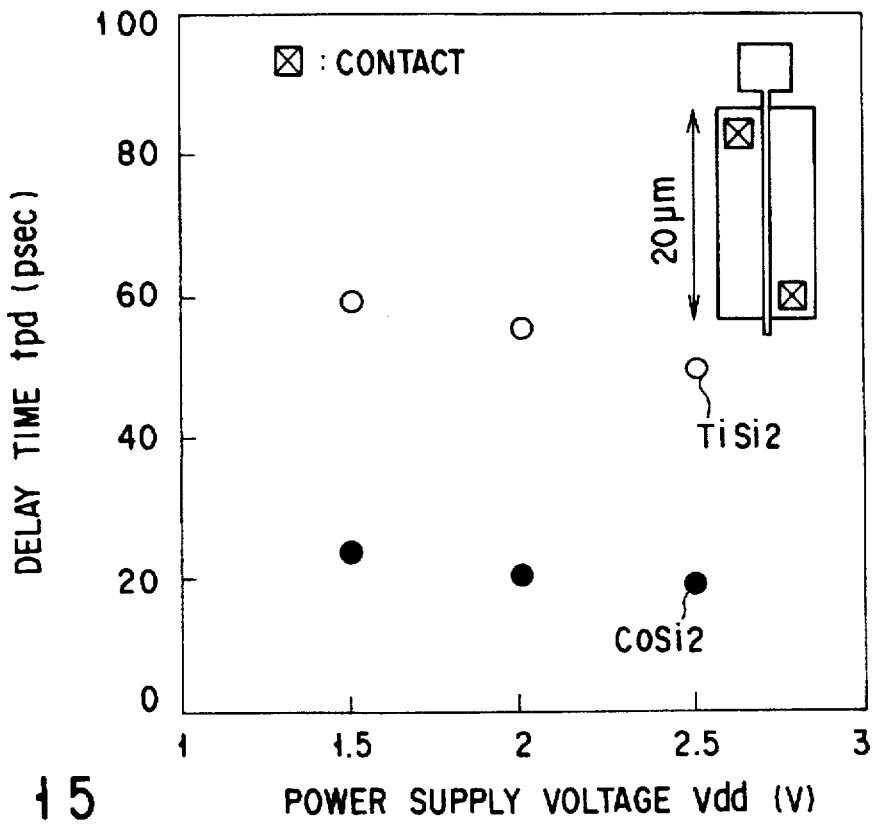
F I G. 15
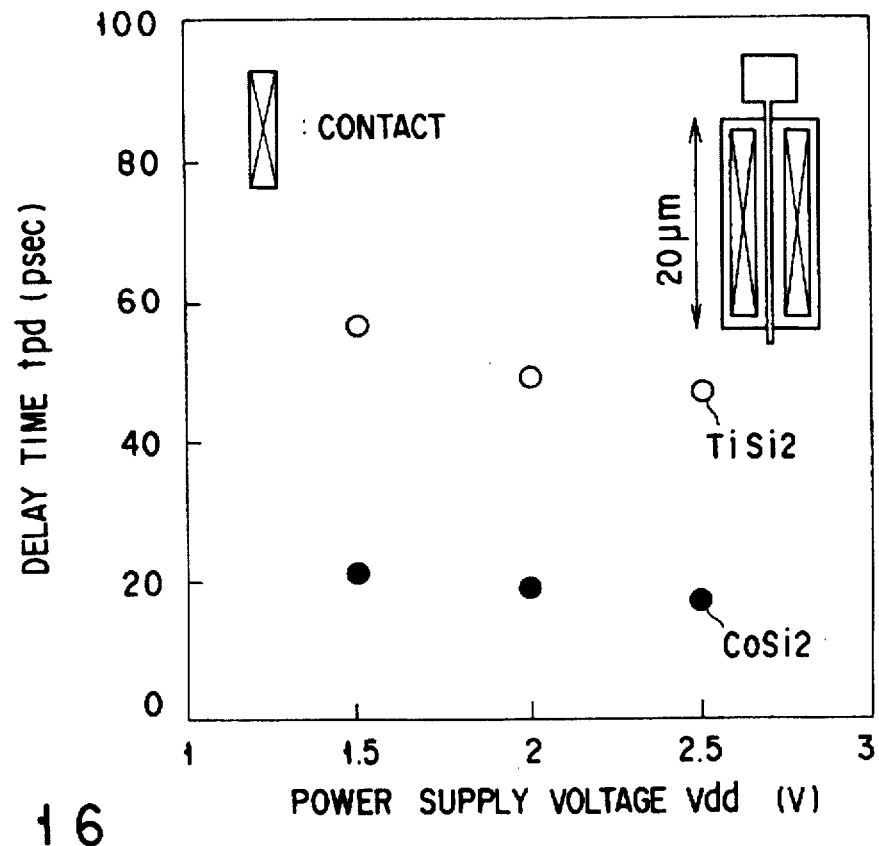
F I G. 16

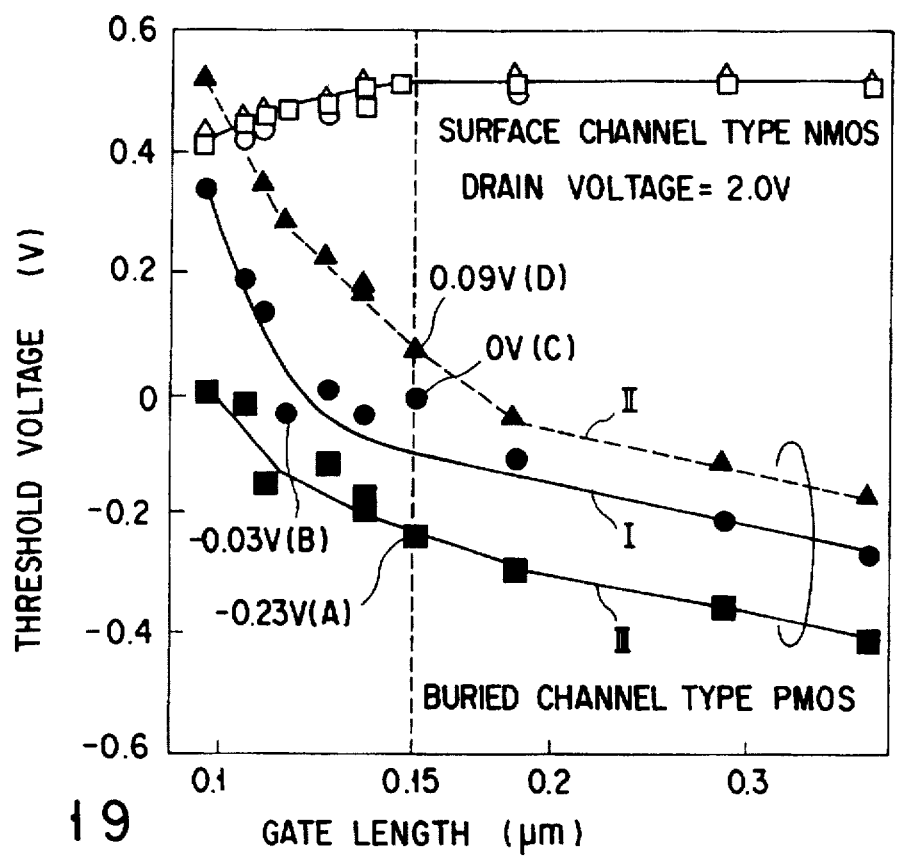
F I G. 19
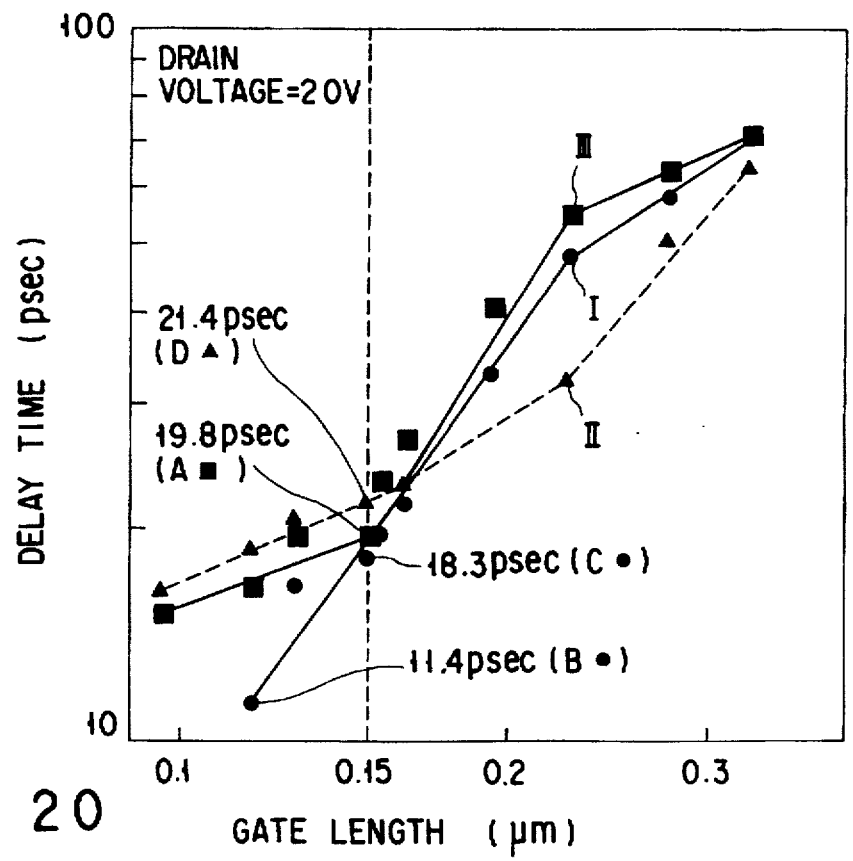
F I G. 20

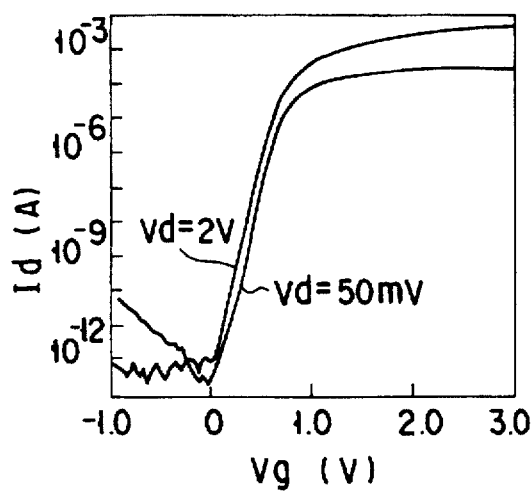
F I G. 22A
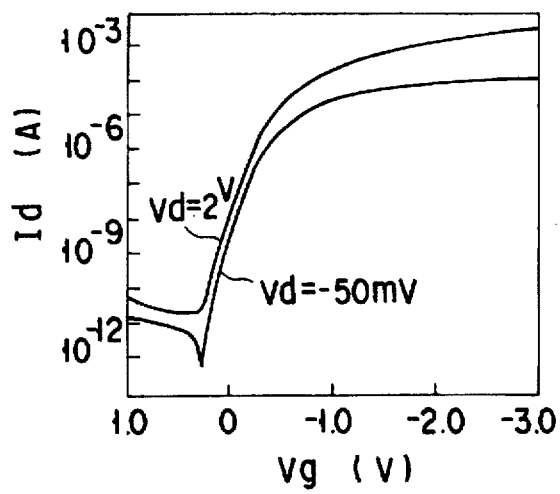
F I G. 22B
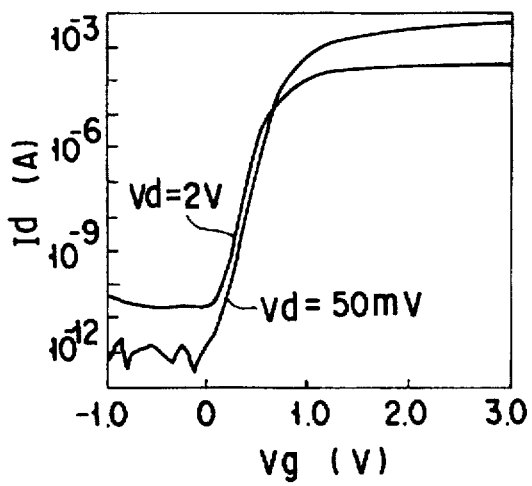
F I G. 22C
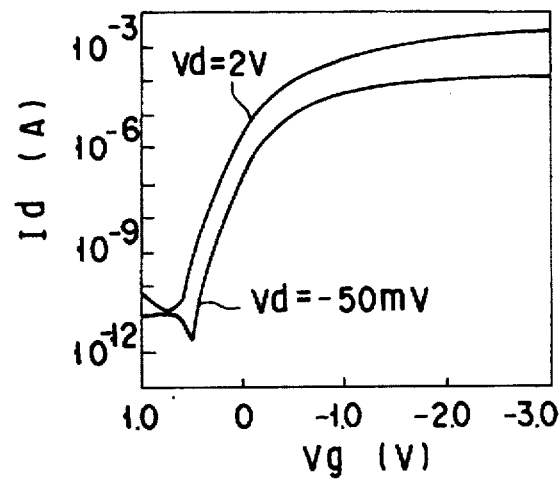
F I G. 22D

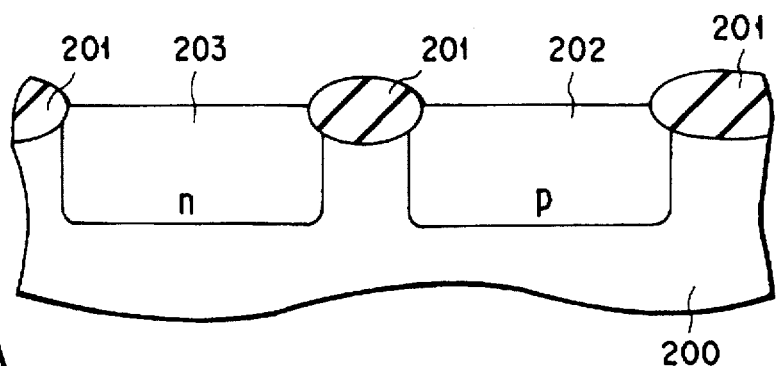
F I G. 23A
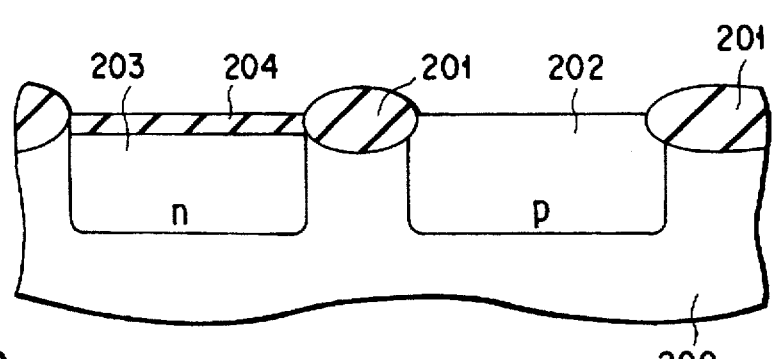
F I G. 23B
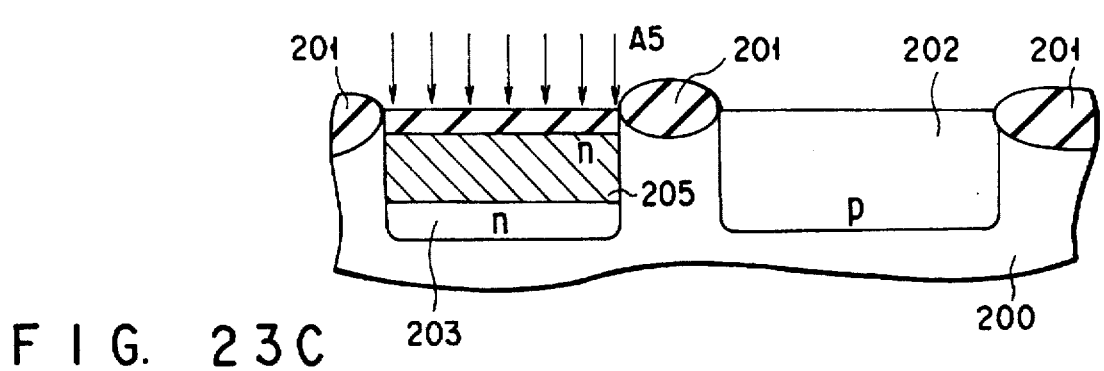
F I G. 23C
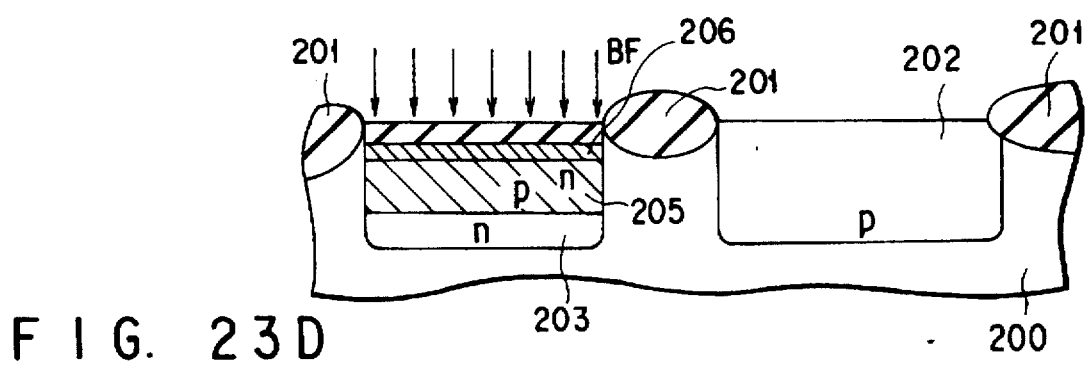
F I G. 23D

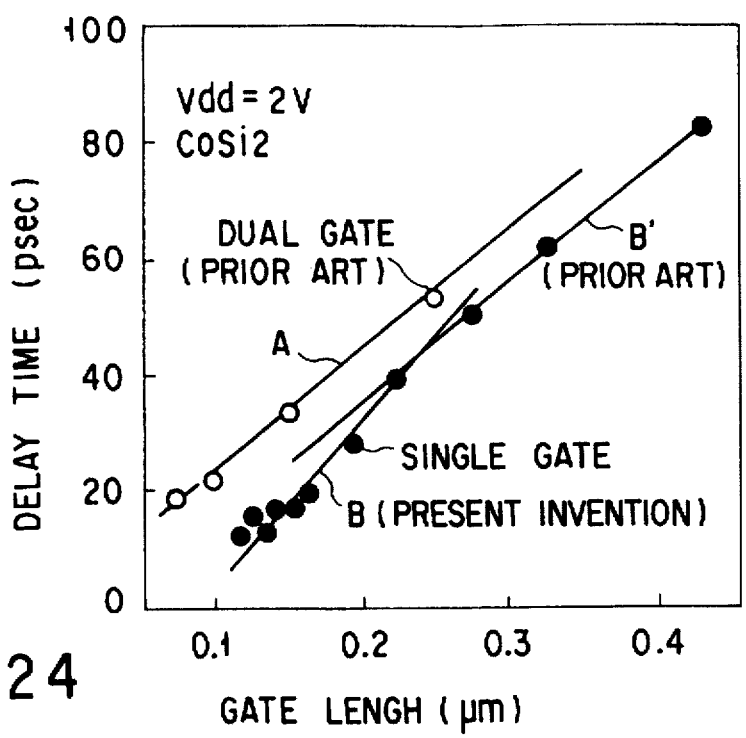
F I G. 24
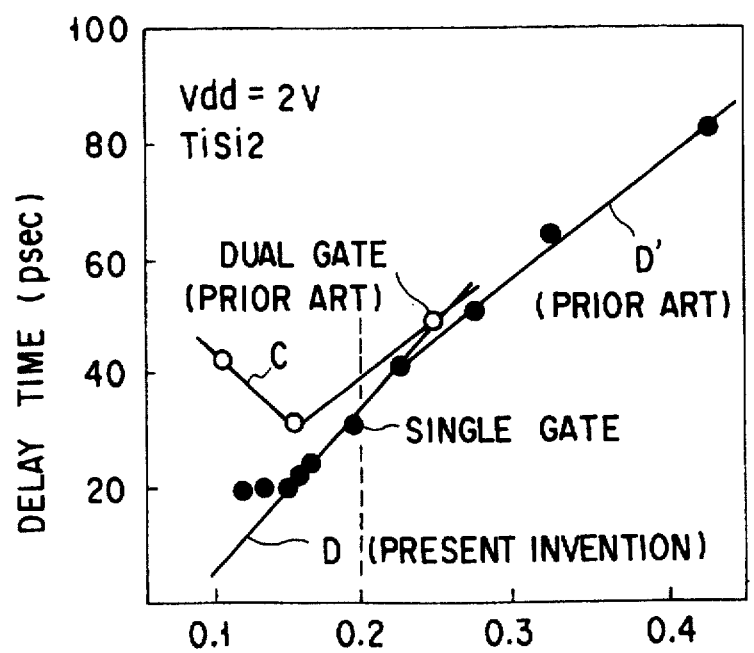
F I G. 25

SEMICONDUCTOR DEVICE INCLUDING A CMOSFET OF A SINGLE-GATE

BACKGROUND OF THE INVENTION

1. Field of the Invention

This invention relates to a semiconductor device having a CMOSFET, in particular, a CMOSFET of a single-gate structure.

2. Description of the Related Art

A CMOSFET of a generally-called single-gate structure is known, wherein the gate electrodes of MOSFETs of different conductivity types have the same conductivity type (for example, the gate electrode of an n-type MOSFET is formed of a polycrystalline silicon film doped with an n-type impurity, and the gate electrode of a p-type MOSFET is formed of a polycrystalline silicon film doped with an n-type impurity).

It is advantageous that the single-gate MOSFET has a high current driving capacity and can be manufactured in a simple process. However, when a p-MOSFET having an n-type gate electrode as described above is of a buried channel type, it is difficult to completely control the channel by the gate electrode since the channel is formed in that portion of a substrate which is deeper than the surface of the same. Accordingly, in the case of a fine structure wherein a gate length is 0.2 µm or less, in particular, a short-channel effect may well appear. This being so, a single-gate CMOSFET has not been achieved so far.

On the other hand, as a CMOSFET with a gate length of 0.2 µm or less, a generally-called dual-gate structure has been proposed, wherein MOSFETs of different conductivity types have gate electrodes of different conductivity types (for example, the gate electrode of an n-type MOSFET is formed of a polycrystalline silicon film doped with an n-type impurity, and the gate electrode of a p-type MOSFET is formed of a polycrystalline silicon film doped with a p-type impurity).

Although it is considered that the dual-gate structure is advantageous in light of the short-channel effect, it has the following drawbacks:

When a gate length is less than 2.0 µm and a thin gate insulating film is adopted, the p-type impurity contained in the gate electrode of the p-type MOSFET may diffuse into the channel region, thereby varying the threshold voltage. The number of the scattering factors which cause surface roughness scattering may increase, thereby reducing the mobility of carriers contained in the channel and hence reducing the driving capacity of the MOSFET. Thus, the MOSFET cannot realize sufficient high-speed performance. Moreover, a decrease in the driving capacity may vary the threshold voltage of the MOSFET.

In addition, it is known that the employment of a gate electrode made of a metal silicide in the MOSFET will shorten its delay time. As the metal silicide, Pt silicide, Ti silicide or Co silicide is used. In the case of CMOSFETs of the dual-gate structure, Ti silicide can most effectively shorten the delay time when the gate length is relatively long. Specifically, where the gate length is longer than 0.15 µm, the delay time proportionally shortens as the gate length shortens. However, where the gate length is shorter than 0.15 µm, it is known that the delay time lengthens as the gate length shortens (see FIG. 11). On the other hand, in the case of using Pt or Co silicide, the delay time shortens substantially proportionally as the gate length shortens even when it is shorter than 0.15 µm. In the range of 0.15 µm or less, Co silicide is most advantageous.

As regards CMOSFETs of the single-gate structure, the validity of Co silicide in a short gate-length range is not examined, since such a CMOSFET as can normally operate when the gate length is shorter than 0.2 µm has not yet been realized. In the case of using Ti silicide, too, it has been unclear whether or not the CMOSFET of the single-gate structure can operate in the same manner as the dual-gate structure.

SUMMARY OF THE INVENTION

It is the object of the invention to provide a semiconductor device equipped with a single-gate CMOSFET having a sufficiently high speed performance and whose threshold voltage is easily adjustable even where the device is greatly fined.

According to a first aspect of the invention, there is provided a semiconductor device comprising:

a semiconductor substrate having a major surface;

a first semiconductor region of a first conductivity type selectively formed on the major surface of the semiconductor substrate;

a second semiconductor region of a second conductivity type formed on the major surface of the semiconductor substrate and electrically isolated from the first semiconductor region; and a CMOSFET including a first channel type MOSFET formed in the first semiconductor region and a second channel type MOSFET formed in the second semiconductor region;

wherein:

the first channel type MOSFET has a first gate insulating film formed on a predetermined portion of the first semiconductor region, a first gate electrode formed on the first gate insulating film, made of a first conductivity type semiconductor and having a gate length of 0.2 µm or less, first source/drain regions of the second conductivity type respectively formed in the first semiconductor region along both sides of the first gate electrode, and a buried channel region of the second conductivity type formed in the first semiconductor region just below the first gate electrode; and the second channel type MOSFET has a second gate insulating film formed on a predetermined portion of the second semiconductor region, a second gate electrode formed on the second gate insulating film, made of the first conductivity type semiconductor and having a gate length of 0.2 µm or less, and second source/drain regions of the first conductivity type respectively formed in the second semiconductor region along both sides of the second gate electrode.

It is desirable that the first channel type MOSFET and the second channel type MOSFET are formed of a p-channel type MOSFET and an n-channel type MOSFET, respectively, and the first and the second gate electrode is formed of n-type polycrystalline silicon.

According to a second aspect of the invention, there is provided a semiconductor device comprising:

a semiconductor substrate having a major surface;

a first semiconductor region of a first conductivity type selectively formed on the major surface of the semiconductor substrate;

a second semiconductor region of a second conductivity type formed on the major surface of the semiconductor substrate and electrically isolated from the first semiconductor region; and a CMOSFET including a first channel type MOSFET formed in the first semiconductor region and a second channel type MOSFET formed in the second semiconductor region;

wherein:

the first channel type MOSFET has a first gate insulating film formed on a predetermined portion of the first semiconductor region, a first gate electrode formed on the first gate insulating film, made of a first conductivity type semiconductor and having a gate length of 0.4 μm or less, a first alloy layer formed on the first gate electrode and made of the first conductivity type semiconductor and cobalt, first source/drain regions of the second conductivity type respectively formed in the first semiconductor region along both sides of the first gate electrode, and a buried channel region of the second conductivity type formed in the first semiconductor region just below the first gate electrode; and the second channel type MOSFET has a second gate insulating film formed on a predetermined portion of the second semiconductor region, a second gate electrode formed on the second gate insulating film, made of the first conductivity type semiconductor and having a gate length of 0.4 μm or less, a second alloy layer formed on the second gate electrode and made of the first conductivity type semiconductor and cobalt, and second source/drain regions of the first conductivity type respectively formed in the second semiconductor region along both sides of the second gate electrode.

It is desirable that the first channel type MOSFET and the second channel type MOSFET are formed of a p-channel type MOSFET and an n-channel type MOSFET, respectively, the first and the second gate electrode is formed of n-type polycrystalline silicon, and the first and the second alloy layer is formed of cobalt silicide film.

According to a third aspect of the invention, there is provided a semiconductor device comprising:

a semiconductor substrate having a major surface;

a first semiconductor region of a first conductivity type selectively formed on the major surface of the semiconductor substrate;

a second semiconductor region of a second conductivity type formed on the major surface of the semiconductor substrate and electrically isolated from the first semiconductor region; and a CMOSFET including a first channel type MOSFET formed in the first semiconductor region and a second channel type MOSFET formed in the second semiconductor region;

wherein:

the first channel type MOSFET has a first gate insulating film formed on a predetermined portion of the first semiconductor region, a first gate electrode formed on the first gate insulating film, made of a first conductivity type semiconductor and having a gate length of 0.2 μm or less, a first alloy layer formed on the first gate electrode and made of the first conductivity type semiconductor and titanium, first source/drain regions of the second conductivity type respectively formed in the first semiconductor region along both sides of the first gate electrode, and a buried channel region of the second conductivity type formed in the first semiconductor region just below the first gate electrode; and the second channel type MOSFET has a second gate insulating film formed on a predetermined portion of the second semiconductor region, a second gate electrode formed on the second gate insulating film, made of the first conductivity type semiconductor and having a gate length of 0.2 μm or less, a second alloy layer formed on the second gate electrode and made of the first conductivity type semiconductor and titanium, and second source/drain regions of the first conductivity type respectively formed in the second semiconductor region along both sides of the second gate electrode.

It is desirable that the first channel type MOSFET and the second channel type MOSFET are formed of a p-channel type MOSFET and an n-channel type MOSFET, respectively, the first and the second gate electrode is formed of n-type polycrystalline silicon, and the first and the second alloy layer is formed of titanium silicide film.

Preferably, through the first—third aspects, the first semiconductor region has a peak impurity concentration falling within a range of from $2 \times 10^{17}$ cm$^{-3}$ to $2 \times 10^{18}$ cm$^{-3}$, and the buried channel region has a peak impurity concentration not less than $2 \times 10^{18}$ cm$^{-3}$ and also higher than the peak impurity concentration of the first semiconductor region. More preferably, the peak impurity concentration of the first semiconductor region falls within a range of from $6 \times 10^{17}$ cm$^{-3}$ to $2 \times 10^{18}$ cm$^{-3}$. Further, the peak impurity concentration of the buried channel region is more preferably not less than $4 \times 10^{18}$ cm$^{-3}$.

More preferably, the peak impurity concentration of the buried channel region is higher than the peak impurity concentration of the first semiconductor region and is lower than ten times of the same.

Also preferably, the junction between the buried channel region and the first semiconductor region is formed at a level of 0.08 μm or less below the surface of the semiconductor substrate, and more preferably 0.5 μm or less.

Preferably, the buried channel region has a peak carrier concentration at a level 0.5 μm or less below the surface of the semiconductor substrate, and more preferably 0.2 μm or less.

Yet preferably, the first and second gate insulating films have a thickness of 6 nm or less.

According to the researches made by the inventors, it was found that even where the gate length of the single-gate CMOSFET is 0.2 μm or less, it is possible to easily adjust its threshold voltage and to operate the CMOSFET at high speed as a result of making the conductivity of the channel region opposite to that of the gate electrode by forming a shallow second-conductivity type buried region in a first-conductivity type semiconductor region located just below the first-conductivity type gate electrode of a first-channel type MOSFET.

Further, it was confirmed that making the gate electrodes of the CMOSFET of titanium or cobalt silicide can further shorten the delay time, which enables the performance of the conventional dual-gate CMOSFET to be realized by a single-gate CMOSFET which has a more simple structure than the former.

In addition, it was found that using a cobalt silicide film as a metal silicide film for forming the gate electrode, etc. in the single-gate CMOSFET can shorten the delay time as compared with the case of using a titanium silicide film, when the channel length is 0.4 μm or less.

FIG. 26 is a view, useful in explaining the advantage of the invention over the prior art, and showing the relationship between the gate length and the delay time. In FIG. 26, white dots indicate conventional dual-gate CMOSFETs of short gate lengths which are formed of different gate electrode materials. Numerals attached to the white circles denote respective operating voltages. On the other hand, black dots indicate a conventional single-gate CMOSFET of a shortest gate length and single-gate CMOSFETs of the invention (using a titanium silicide film and a cobalt silicide film).

Line E indicates the overall trend of the prior art concerning shortening of the delay time. Line F indicates the delay time-shortening direction of the single-gate CMOSFET of the invention. As is evident from line F, the invention can perform a high speed operation which cannot be expected from the conventional trend.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiment of the invention and, together with the general description given above and the detailed description of the preferred embodiments given below, serve to explain the principles of the invention.

FIG. 1 is a sectional view, showing the structure of a CMOSFET of a single-gate structure according to a first embodiment of the invention;

FIG. 2 is a graph, showing the concentration distribution of impurities contained in the channel region of the CMOSFET of the first embodiment in the direction of the depth of a substrate;

FIGS. 6A and 6B are graphs, showing the relationship between the drain-current/gate-width and the drain voltage of the CMOSFET of the first embodiment, FIG. 6A showing the case of an n-MOSFET and FIG. 6B the case of a p-MOSFET;

FIG 7 is a graph, showing the relationship between the drain current and the gate length of the CMOSFET of the first embodiment;

FIG. 8 is a graph, showing the relationship between the mutual conductance and the gate length of the CMOSFET of the first embodiment;

FIGS. 12 to 16 are graphs, each showing the relationship between the delay time of a single-gate CMOSFET (as shown in FIG. 1) using the $TiSi_2$ film as a metal silicide film and the power voltage, and between that of a single-gate CMOSFET using the $CoSi_2$ film as the metal silicide film and the power voltage, in the case of using a CMOSFET pattern shown therein;

FIG. 19 is a graph, showing the relationship between the threshold voltage and the gate length of each of CMOSFETs which have p-type source/drain regions of the LDD structure formed under three different ion injection conditions;

FIG. 20 is a graph, showing the relationship between the delay time and the gate length of each of CMOSFETs which have p-type source/drain regions of the LDD structure formed under three different ion injection conditions;

FIGS. 22A to 22D are graphs, showing the relationship between the drain current and the gate voltage at points A and B in FIGS. 19 and 20;

FIGS. 23A to 23G are sectional views, showing in a stepwise manner method for manufacturing a single-gate CMOSFET according to a second embodiment of the invention;

FIG. 24 is a graph, useful in comparing the relationship between the delay time and the gate length of a converter using the single-gate CMOSFET of the invention which employs a Co silicide electrode, with the relationship between the delay time and the gate length of each of converters using the conventional single-gate and dual-gate CMOSFETs with Co silicide electrodes;

FIG. 25 is a graph, useful in comparing the relationship between the delay time and the gate length of a converter using the single-gate CMOSFET of the invention which employs a Ti silicide electrode, with the relationship between the delay time and the gate length of each of converters using the conventional single-gate and dual gate CMOSFETs with Ti silicide electrodes.

DETAILED DESCRIPTION OF THE PREFERRED EMBODIMENTS

Figure 3:
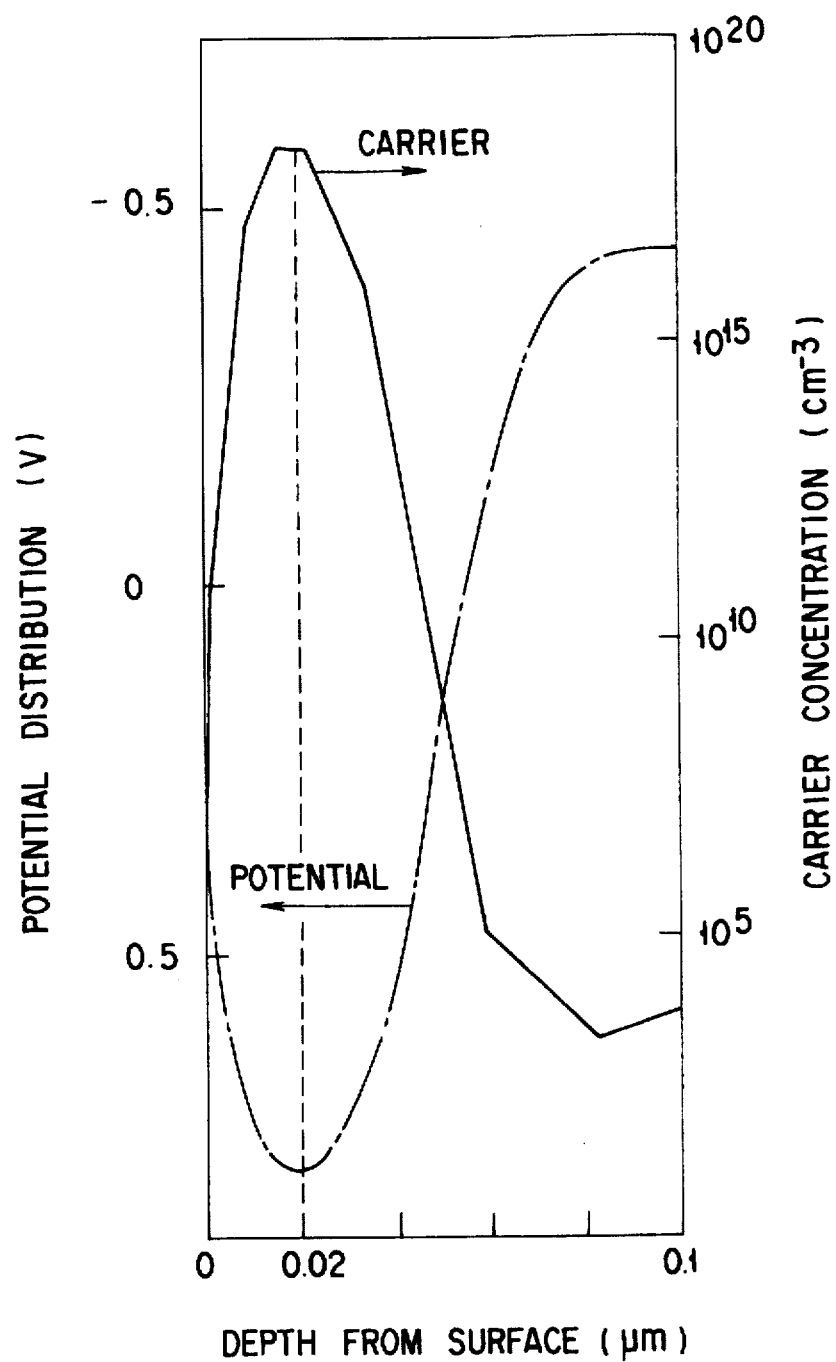
FIG. 3 is a graph, showing the distributions of potential and carrier concentration in the channel region of the CMOSFET of the first embodiment in the direction of the depth of the substrate.

The embodiments of the invention will be described with reference to the accompanying drawings.
(First Embodiment)

FIG. 1 is a sectional view, showing the structure of a CMOSFET of a single-gate structure according to a first embodiment of the invention.

As is shown in FIG. 1, an element-separating insulation film 102 for separating element regions is formed on an silicon substrate 101 by the LOCOS method.

A p-type buried channel layer 107 is formed, by ion injection, in that surface portion of an n-well 104 in a p-MOSFET region 116 (wherein a p-MOSFET is formed), which is just below a gate electrode 112. In other words, the p-MOSFET is of a buried channel type wherein the channel is formed in the p-type buried channel layer 107, below the surface thereof.

On the other hand, no buried channel layer is formed in that surface portion of a p-well 103 in an n-MOSFET region 115 (wherein an n-MOSFET is formed), which is just below a gate electrode 111. In other words, the n-MOSFET is of a surface channel type wherein the channel is formed in that surface portion of the p-well 103 which is below a gate oxide film 109.

Moreover, the gate electrode 111 of the n-MOSFET and the gate electrode 112 of the p-MOSFET are formed of polycrystalline silicon films doped with an n-type impurity.

The p-type well 103 has n-type source/drain regions 105a and 105b of an LDD (Lightly Doped Drain) structure. The n-type LDD regions 105a are formed shallower and have a lower impurity concentration than the n-type source/drain regions 105b. Similarly, the n-type well 104 has p-type source/drain regions 106a and 106b of the LDD structure.

Metal silicide films 113 made of an alloy of a metal and silicon are formed on the source/drain regions 105b and on the gate electrode 111, so as to reduce the resistance. Similarly, metal silicide films 114 made of an alloy of a metal and silicon are formed on the source/drain regions 106b and on the gate electrode 112, so as to reduce the resistance.

A Ti silicide film or a Co silicide film is used as each of the metal silicide films 113 and 114.

In FIG. 1, reference numerals 108 and 110 denote a gate oxide film and gate side wall insulating films.

FIG. 2 shows the distribution of impurities contained in the n-well 104 wherein the p-type buried channel layer 107 is formed. The impurity distribution is obtained by SIMS (Secondary Ion Mass Spectroscopy). In the figure, the abscissa indicates the depth from the surface of the substrate, and the ordinate the impurity concentration.

As is evident from FIG. 2, the peak concentration of a p-type impurity (B) in the p-type buried channel layer 107 is $4 \times 10^{18}$ cm$^{-3}$, and that of an n-type impurity (As) in the n-well 104 is $6 \times 10^{17}$ cm$^{-3}$. In other words, the peak concentration of the p-type impurity is about 7 times the peak concentration of the n-type impurity. Further, the pn-junction is formed at a relatively shallow portion of the substrate located 0.5 µm below the surface. This junction is realized by forming the n-well with the relatively high impurity concentration of $6 \times 10^{17}$ cm$^{-3}$ (in the conventional case, the impurity concentration of the n-well is $5 \times 10^{17}$ cm$^{-3}$ or less), and injecting therein the p-type impurity of the concentration higher than the n-well to form a p-type buried channel layer.

It is desirable to set the impurity concentration of the n-well to a value falling within a range of $6 \times 10^{17}$ cm$^{-3}$–$2 \times 10^{18}$ cm$^{-3}$. If it exceeds the range, the threshold voltage of the p-channel MOSFET becomes as low as −1 V or less. Preferably, the peak concentration of the p-type impurity should be set higher than the peak concentration of the n-type impurity and is lower than 10 times of the same. If it is more than 10 times of the peak concentration of the n-type impurity, the junction is formed at a deeper portion, which is not preferable in light of the short channel effect. More preferably, the ratio of the p-type impurity peak concentration to the n-type impurity peak concentration is set to a value falling within a range of from 4 to 8.

The junction of the buried region is formed preferably 0.8 µm or less below the surface of the substrate, and more preferably 0.5 µm or less below the same. The thickness of the gate insulation film is preferably 6 nm or less, and more preferably 3 to 5 nm.

FIG. 3 shows the relationship between the depth of the substrate and the potential (potential distribution), and between the depth of the substrate and the carrier concentration (carrier concentration distribution) obtained by simulation based on the impurity concentration distribution shown in FIG. 2.

In FIG. 3, the solid line indicates the carrier concentration, and the one-dot chain line the potential. The peak position of the carrier concentration indicates the depth at which the channel is formed. As is evident from FIG. 3, the depth is 0.02 µm. Since the channel region is formed at a shallow portion of 0.02 µm from the surface, even if the gate length is as fine as 0.2 µm or less, the MOSFET can operate normally and at high speed. Moreover, if the peak position of the carrier concentration which corresponds to the depth at which the channel is formed is set to 0.05 µm or less, the above advantages (normal operation and high speed operation) can be achieved.

Figure 4:
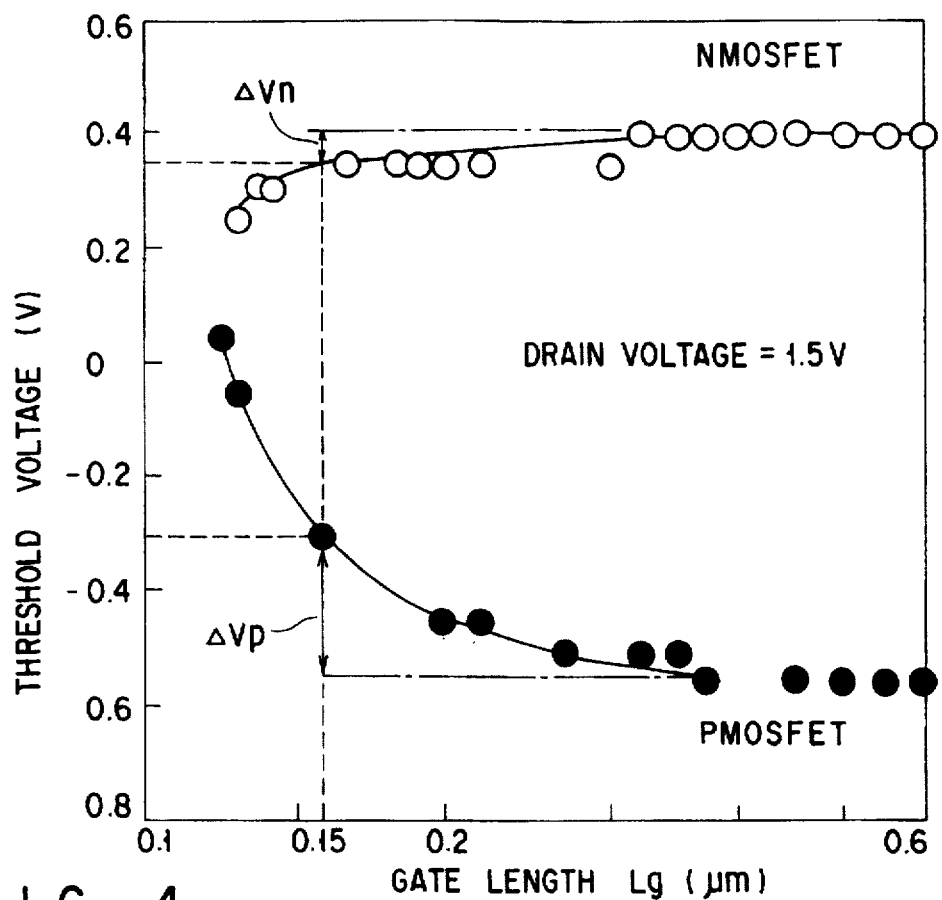
FIG. 4 is a graph, useful in explaining the relationship between the gate length and the threshold voltage of the CMOSFET of the first embodiment.

FIG. 4 shows the relationship between the threshold voltage and the gate length of the p-MOSFET employed in the embodiment, and between the threshold voltage and the gate length of the n-MOSFET employed in the embodiment. As is shown in FIG. 4, in the case where the gate length Lg is 0.15 µm, the threshold values of the n-MOSFET and the p-MOSFET are about 0.3 V and about −0.3 V, respectively.

In addition, it is evident from FIG. 4 that a shift from the normal threshold value occurring when the gate length is 0.15 µm is slightly higher than 0.25 V (=|−0.25 V|) in the case of the p-MOSFET (as is indicated by ΔVp), and slightly lower than 0.1 V in the case of the n-MOSFET (as is indicated by ΔVn). In other words, the shift in threshold value is within a range of 0.3 V or less at an absolute value, whereby the short channel effect is restrained to the extent of enabling normal operation of the MOSFETs.

Figure 5:
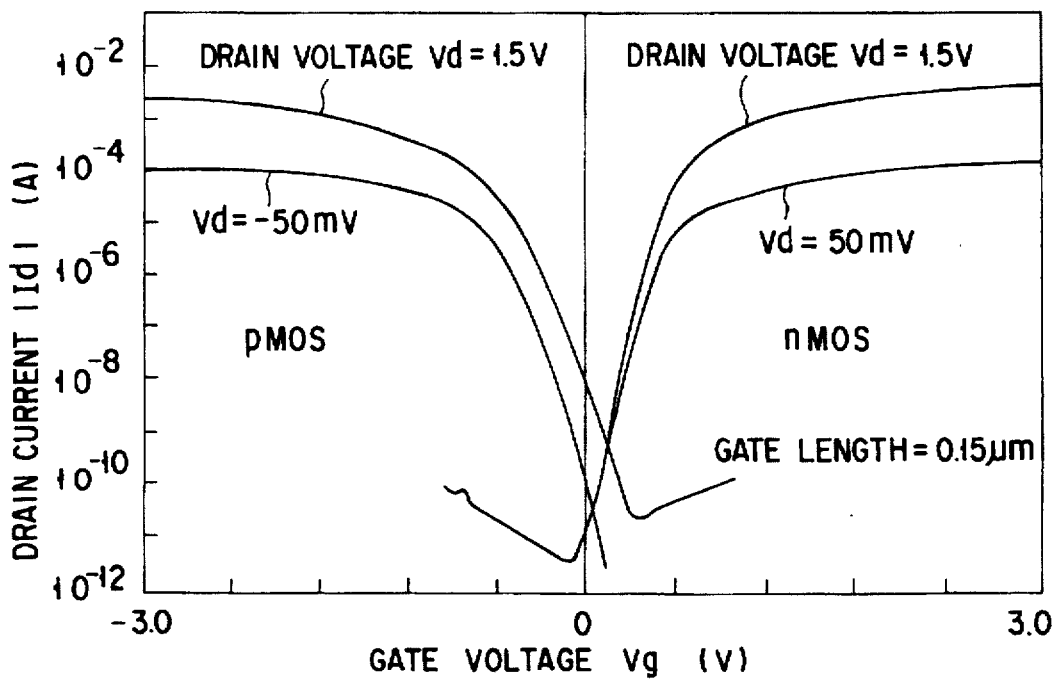
FIG. 5 is a graph, showing the sub-threshold characteristic of the CMOSFET of the first embodiment.

FIG. 5 shows the sub-threshold characteristics of the p-MOSFET and the n-MOSFET which have a gate length of 0.15 µm. In FIG. 5, the abscissa indicates the gate voltage Vg applied to the p-MOSFET and the n-MOSFET, and the ordinate the absolute value |Id | of the drain current. As is understood from FIG. 5, the threshold voltages of the p-MOSFET and the n-MOSFET are both normal, and the leak current is restrained to $10^{-8}$ A/nm or less. It is also understood that when the gate voltage is 1.5 V, the MOSFETs normally operate without a short channel effect such as punch-through.

FIG. 6A shows the relationship between the drain current/gate width and the drain voltage Vd of the n-MOSFET which has a gate length of 0.15 µm, and FIG. 6B the same relationship concerning the p-MOSFET with the same gate length. It is understood from these figures that the n-MOSFET and the p-MOSFET operate normally, and that when the gate voltage is 1.5 V, the n-MOSFET obtains a high current of 0.24 mA/µm, and the p-MOSFET a high current of 0.125 mA/µm.

FIG. 7 shows the relationship between the drain current and the gate length obtained when the gate voltage and the drain voltage are both 1.5 V. FIG. 8 shows the relationship between the mutual conductance and the gate length. From FIGS. 7 and 8, it is evident that the single gate CMOSFET of the invention, in particular, the buried channel type p-MOSFET obtains a high driving current in a short-gate-length range (0.2 µm or less).

Figure 9:
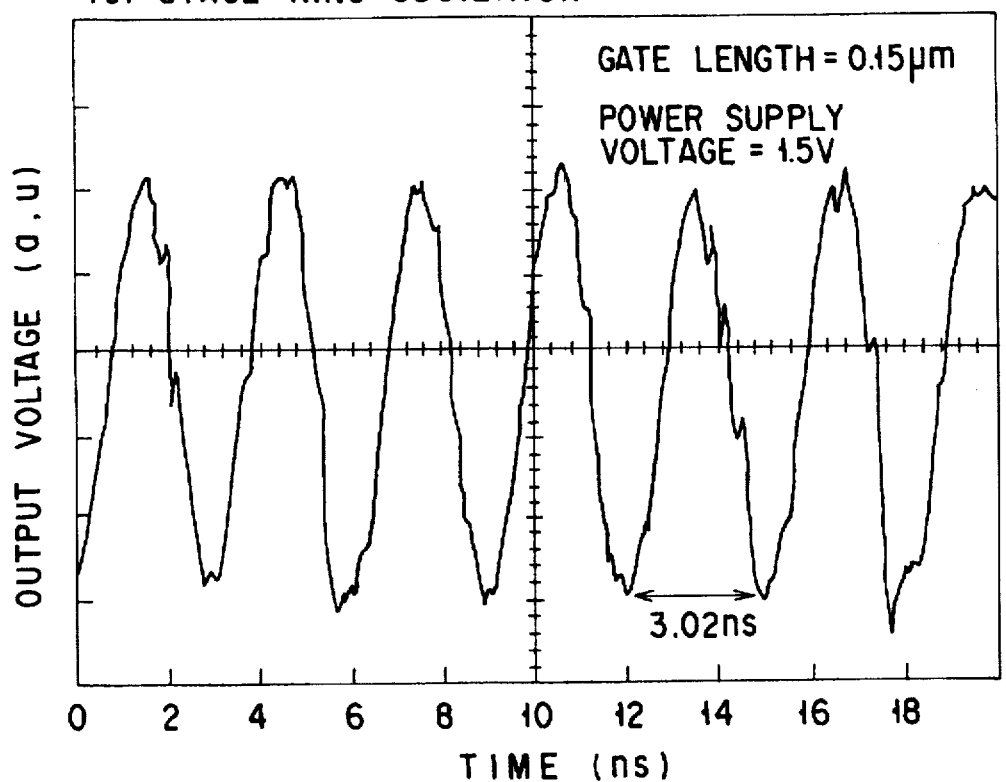
FIG. 9 is a graph, showing the performance of a 101-stage ring oscillator constituted by the CMOSFET of the first embodiment.

FIG. 9 shows the oscillation waveform of a 101-stage ring oscillator (Fan-out=1) which is driven by a power voltage of 1.5 V and uses a CMOSFET with a Co silicide gate of a gate length of 0.15 µm. In light of the fact that the oscillation cycle is 3.02 ns, the delay time of each stage is considered to be only 15.4 psec.

The characteristics of the CMOSFET using a cobalt silicide ($CoSi_2$) film as the metal silicide film will now be compared with those of the CMOSFET using a titanium silicide ($TiSi_2$) film as the metal silicide film.

Figure 10:
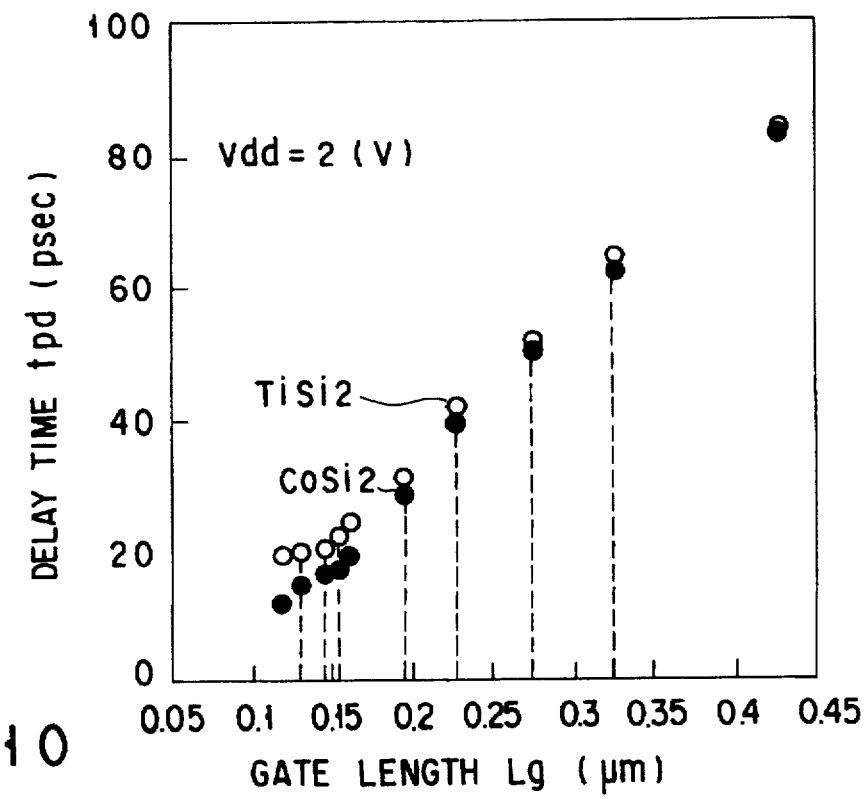
FIG. 10 is a graph, showing the relationship between the delay time and the gate length of each of two single-gate CMOSFETs as shown in FIG. 1, one of the CMOSFETs using a $TiSi_2$ film as a metal silicide, and the other using a $CoSi_2$ film as the metal silicide.

FIG. 10 shows the relationship between the delay time tpd and the gate length of a single-gate CMOSFET using the $CoSi_2$ film, and between those of a single-gate CMOSFET using the $TiSi_2$ film.

It is evident from FIG. 10 that concerning the single-gate CMOSFET, the delay time is shorter in the case of using the $CoSi_2$ film than in the case of using the $TiSi_2$ film, when the gate length is shorter than 0.4 µm.

Figure 11:
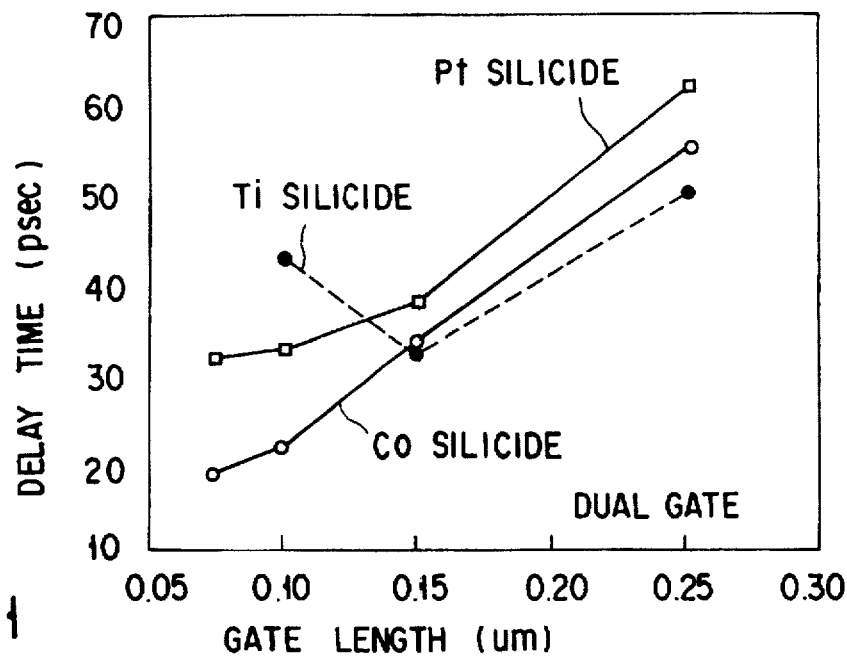
FIG. 11 is a graph, useful in explaining how the dependency of the delay time of a conventional dual-gate CMOSFET upon its gate length varies in accordance with the kind of the metal silicide.
Figure 13:
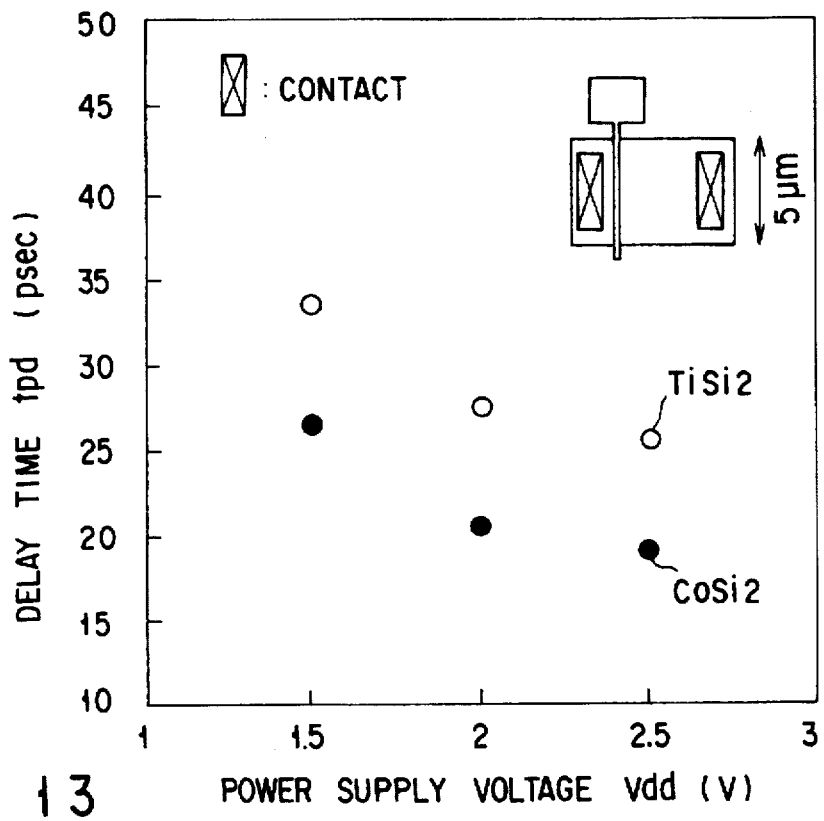
Figure 14:
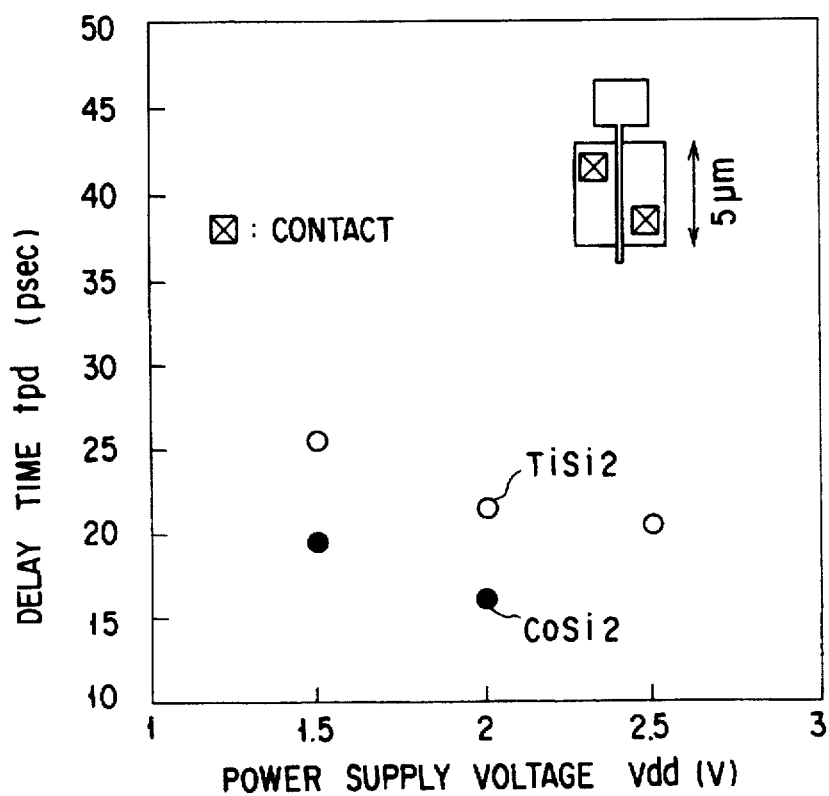

On the other hand, concerning a dual-gate CMOSFET, it is understood from FIG. 11 that the delay time is shorter in the case of using the $TiSi_2$ film in a long-gate-length range of 0.15 µm or more, whereas in a short-gate-length range of less than 0.15 µm, the delay time is longer in the case of using the $TiSi_2$ film than in the case of using the $CoSi_2$ film. In the present invention, the above phenomenon concerning the $TiSi_2$ film is not found, and the high speed performance due to miniaturization is obtained in a gate-length range of 0.15 to 0.1 µm. Concerning the $CoSi_2$ film, the delay time is shortened substantially in proportion to the gate length even in the gate-length range of 0.2 µm or less.

Accordingly, in the single-gate CMOSFET of the invention, both the $TiSi_2$ film and the $CoSi_2$ film can provide a high speed performance even in the gate-length range of 0.2 µm or less. If, however, the delay time is regarded as important, it is preferable to use the $CoSi_2$ film in a short-gate-length range of 0.4 µm or less.

FIGS. 12 to 16 each show the relationship between the power voltage and the delay time tpd of a single-gate CMOSFET (with a gate length of 0.15 µm) using the $TiSi_2$ film as the metal silicide film, and between the power voltage and the delay time tpd of a single-gate CMOSFET using the $CoSi_2$ film as the metal silicide film. In FIGS. 12 to 16, different MOSFET patterns as shown therein are used. The pattern shown in FIG. 12 is a standard pattern.

It is evident from FIGS. 12 to 16 that the delay time tpd is shorter in the case of using the $CoSi_2$ film than in the case of using the $TiSi_2$ film, irrespective of the MOSFET patterns and the power voltage Vdd.

Table 1 shows examples of conditions for forming a single-gate CMOSFET using a cobalt silicide film (conditions for injecting ions into the well and channel regions; the thickness of the gate oxide film; the thickness of the gate side wall insulating film; the activation condition; the composition and thickness of the cobalt silicide film). It should be noted that in order to reduce the junction capacitance, the injection of ions into the well was performed using an acceleration voltage higher than a general one, and the ion injection in the channel region was performed at a distance of 0.4 µm from the gate.

TABLE 1

|  | Buried Channel Type PMOS | Surface Channel Type NMOS |
|---|---|---|
| Well | P: 860 keV, $2 \times 10^{13}$ cm$^{-2}$ | B: 400 keV, $1 \times 10^{13}$ cm$^{-2}$ |
| Channel | As: 140 keV, $1 \times 10^{13}$ cm$^{-2}$ $BF_2$: 15 keV, $4 \times 10^{13}$ cm$^{-2}$ | B: 70 keV, $1 \times 10^{13}$ cm$^{-2}$ B: 30 keV, $1 \times 10^{13}$ cm$^{-2}$ |
| Gate Thickness | 4.3 nm | |
| Side wall Width | 150 nm | |
| Activation | 1000° C., 10 sec | |
| Silicide | $CoSi_2$ (70 nm) | |

The inventors formed three kinds of single-gate CMOSFETs by forming p-type source/drain regions of the LDD structure under three kinds of $BF_2$-injection conditions I, II, and III shown in table 2. In table 2, the left-side data indicate the ion injection condition in the LDD region, and the right-side data the ion injection condition in the source/drain region. To activate injected impurity ions, RTA (Rapid Thermal Annealing) was performed at 1000° C. for 10 seconds in the atmosphere of nitrogen.

TABLE 2

| Condition | p– ($BF_2$) | p+ ($BF_2$) |
|---|---|---|
| I | 15 keV, $2 \times 10^{14}$ cm$^{-2}$ | 30 keV, $3 \times 10^{15}$ cm$^{-2}$ |
| II | 15 keV, $2 \times 10^{14}$ cm$^{-2}$ | 50 keV, $3 \times 10^{15}$ cm$^{-2}$ |
| III | 15 keV, $1 \times 10^{14}$ cm$^{-2}$ | 30 keV, $3 \times 10^{15}$ cm$^{-2}$ |

The other process steps are common among the three CMOSFETs.

After the p-type source/drain regions are formed, the native oxide film is removed using dilute hydrofluoric acid, and then a Co film with a thickness of 20 nm and a TiN film with a thickness of 70 nm are formed in this order by sputtering.

Subsequently, a $CoSi_2$ film is formed by first RTA (500° C., 60 seconds), and then non-reacted Co and TiN films, etc. are selectively removed by means of a mixture of $H_2O_2$ and $H_2SO_4$.

The resistance of the $CoSi_2$ film is lowered by second RTA (740° C., 30 seconds). Thereafter, interlayer insulating films, contact holes, wires, etc. are formed in a conventional process for forming a CMOSFET, thereby completing the CMOSFET. After the second RTA, the temperature of a heating process is preferably under that of the second RTA.

Figure 17:
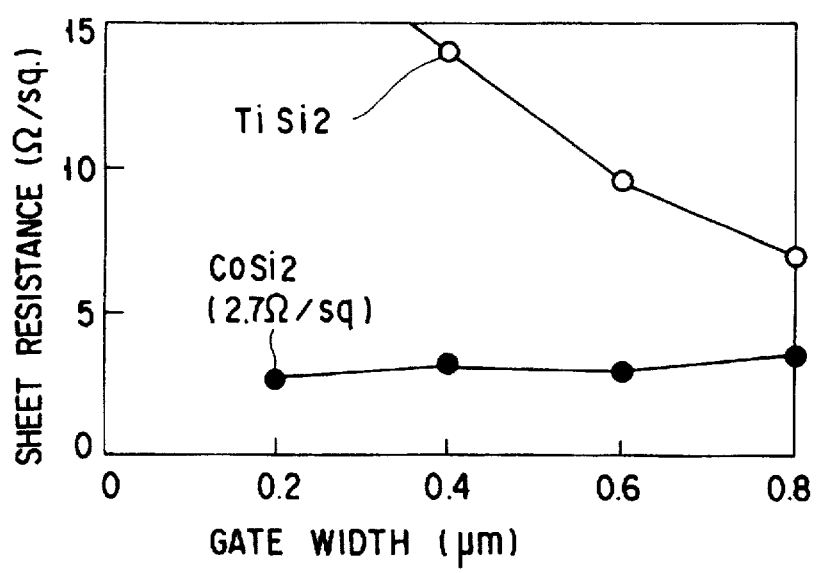
FIG. 17 is a graph, showing the relationship between the sheet resistance and the gate width in the case of using the $TiSi_2$ film as the metal silicide film, and between those in the case of using the $CoSi_2$ film as the metal silicide film.

FIG. 17 shows the relationship between the sheet resistance and the gate width of the $CoSi_2$ film employed in the above-described three kinds of CMOSFETs, and between those of a $TiSi_2$ film as a comparative.

It is evident from FIG. 17 that in the case of using the $CoSi_2$ film, a thin line effect (an increase in resistance occurring where the line is fined) as occurring in the case of the $TiSi_2$ film is not found, thereby achieving a low resistance of 2.7 Ω/sq.

Figure 18:
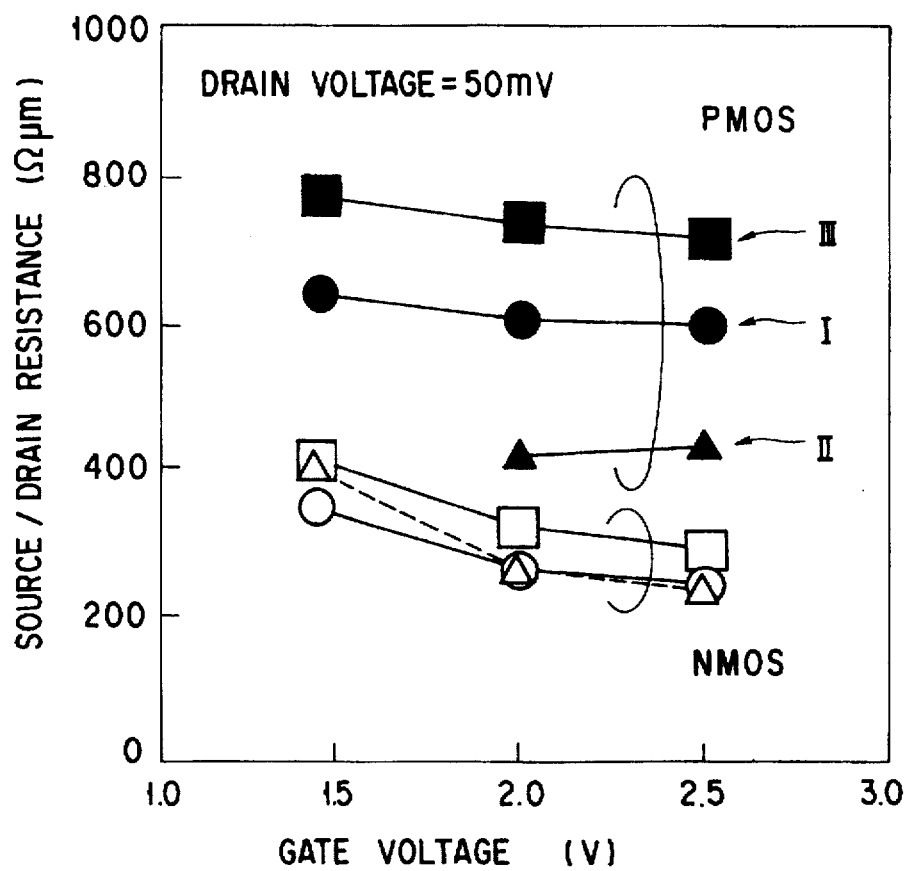
FIG. 18 is a graph, showing the relationship between the source/drain resistance (parasitic resistance) and the gate voltage of each of CMOSFETs which have p-type source/drain regions of the LDD structure formed under three different ion injection conditions.
Figure 21A:
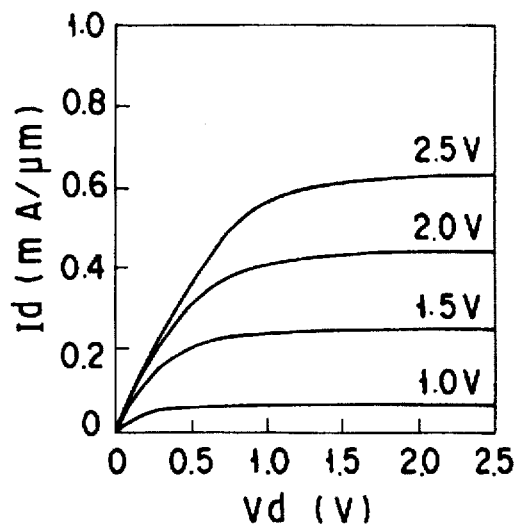
FIGS. 21A to 21D are graphs, showing the relationship between the drain current and the drain voltage at points A and B in FIGS. 19 and 20.
Figure 21B:
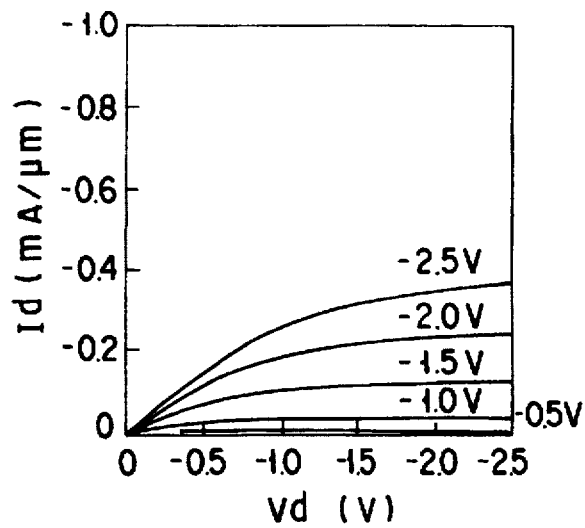
Figure 21C:
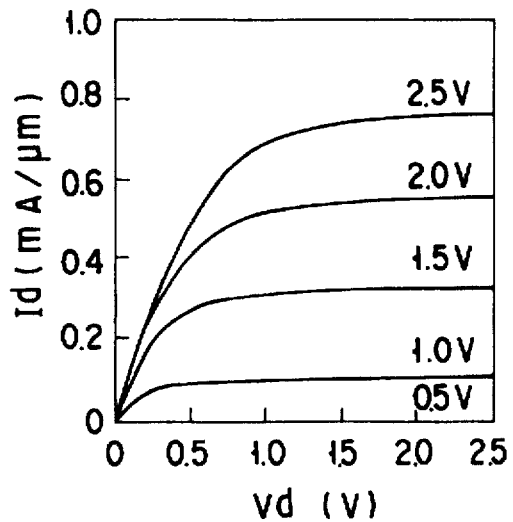
Figure 21D:
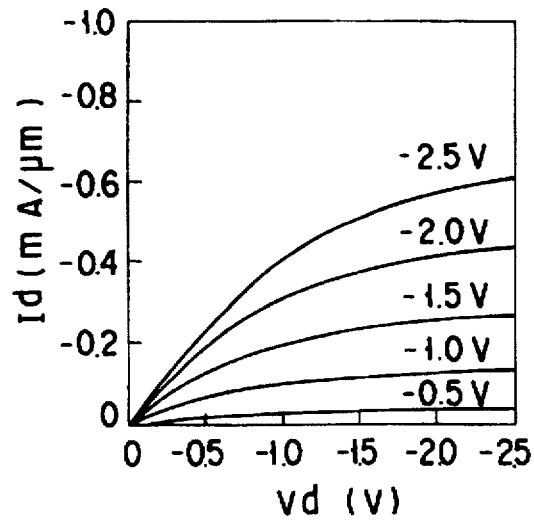

FIG. 18 shows the relationship between the source/drain resistance (parasitic resistance) and the gate voltage of each of the single-gate CMOSFETs produced under the conditions I, II and III. FIG. 19 shows the relationship between the threshold voltage and the gate length of each of the single-gate CMOSFETs produced under the conditions I, II and III.

It is evident from FIGS. 18 and 19 that if the parasitic resistance is low, the short-channel effect is great, whereas if the short-channel effect is small, the parasitic resistance is high. In light of this, in the case of the buried type p-MOSFET with the gate length of 0.15 μm, it is necessary to select the condition III, though the parasitic resistance increases, in order to restrain the short-channel effect.

FIG. 20 shows the relationship between the delay time and the gate length of each of the single-gate CMOSFETs produced under the conditions I, II and III. As is shown in FIG. 20, in a long-gate-length range, the delay time is shortest under the condition II where the source/drain parasitic resistance of the p-MOSFET is minimum. However, when the gate length is shorter than 0.15 μm, the short-channel effect becomes too great to cut off the p-MOSFET, and the delay time is longest under the condition II. Under the condition II, at point D where the gate length is 0.15 μm, the delay time is 21.4 psec.

Although the parasitic resistance is greatest under the condition III, the delay time occurring at point A where the gate length is 0.15 μm is 19.8 psec. In other words, substantially the same high speed operation as obtained at point C (18.3 psec) under the condition I can be achieved.

Although in the case of the condition I, it is necessary to restrain the short-channel effect, the delay time is 11.4 psec at point B where the gate length is 0.12 μm. This means that a higher speed operation can be achieved.

For reference, the relationship between the drain current and the drain voltage at each of points A and B are shown in FIGS. 21A to 21D. Further, the relationship between the drain current and the gate voltage at each of points A and B are shown in FIGS. 22A to 22D. Table 3 shows the characteristics of p-MOSFETs for CMOSFETs corresponding to points A and B. From those figures and table, it is understood that they have excellent characteristics.

TABLE 3

| PMOS Condition | 0.15 μm (Point A) Condition III | | 0.12 μm (Point B) Condition I | |
|---|---|---|---|---|
| | NMOS | PMOS | NMOS | PMOS |
| Vth (V) | 0.50 | −0.23 | 0.47 | −0.03 |
| S (mV/dec.) | 78.9 | 98.9 | 78.3 | 107 |
| gm (mS/mm) | 396 | 234 | 425 | 310 |
| Id (mA/μm) (@|Vg| = |Vd| = 2V) | 0.44 | −0.24 | 0.55 | −0.42 |
| Delay Time (psec) | 19.8 | | 11.4 | |

As is shown in table 4, the delay time of 11.4 psec obtained in the invention is lower than delay time values obtained in the conventional CMOSFETs (prior art 1 to 5). Thus, the invention can provide a CMOSFET which is operable at higher speed than the conventional ones.

TABLE 4

| | Delay Time (psec) | Gate Length (μm) | Gate Type | Gate Material | Power Source (V) |
|---|---|---|---|---|---|
| Present Invention (Side wall Length) | 11.4 | 0.12 (150 nm) | Single | co Salicide | 2.0 |
| Prior Art 1 | 11.8 | 0.1 | Dual | Pt Salicide | 2.5 |
| Prior Art 2 | 12.0 | 0.06 | Dual | Wsi Gate | 2.0 |

TABLE 4-continued

| | Delay Time (psec) | Gate Length (μm) | Gate Type | Gate Material | Power Source (V) |
|---|---|---|---|---|---|
| Prior Art 3 (Side Wall Length) | 15.4 | 0.15 (100 nm) | Single | Ti Salicide | 1.5 |
| Prior Art 4 | 17.0 | 0.1 | Dual | Ti Salicide | 2.5 |
| Prior Art 5 | 19.0 | 0.075 | Dual | Co Salicide | 2.0 |

Document 1: K. F. Lee, R. H. Yan, D. Y. Jeon, G. M. Chin, Y. O. Kim, D. M. Tennant, B. Razavi, H. D. Lin, Y. G. Wey, E. H. Westerwick, M. D. Morris, R. W. Jhonson, T. M. Liu, M. Tarsia, M. Cerullo, R. G. Swartz and A. Ourmazd, "Room temperature 0.1 μm-CMOS Technology with 11.8 ps gate delay, " IEDM Tech. Dig., pp. 131 to 134, 1993.

Document 2: K. Takeuchi, T. Yamamoto, A. Furukawa, T. Tamura, and K. Yoshida, "High Performance sub-tenth micron CMOS using advanced boron doping and WSi₂ dual gate process," Symp. on VLSI Tech Digest, pp.9 to 10, 1995.

Document 3: T. Yoshitomi, M. Saito, T. Ohguro, M. Ono, H. S. Momose, and H. Iwai, "A High Performance 0.15 μm Single Gate CMOS Technology, Extended Abstracts of the 1995 International Conference on Solid State Device and Materials, Osaka, pp. 222 to 224, 1995.

Document 4: Y. Taur, S. Wind, Y. J. Mii, Y. Lii, D. Moy, K. A. Jenkins, C. L. Chen, P. J. Coane, D. Klans, J. Bucchignano, M. Rosenfield, M. G. R. Thomson, and M. Polcan, "High Performance 0.1 μm-CMOS Devices with 1.5V Power Supply," IEDM Tech. Dig., pp. 127 to 130, 1993.

Document 5: T. Yamazaki, K. Goto, T. Fukano, Y. Nara, T. Sugi, and T. Ito, "21 psec switching 0.1 μm-CMOS at room temperature using high performance Co silicide process," IEDM Tech. Dig, pp. 906 to 908, 1993.

It is considered that shallow low-concentration source/drain regions in the p-MOSFET can be further improved by a method, such as the solid phase diffusion method, for forming a shallower and higher-concentration diffusion layer than the ion injection method.

(Second Embodiment)

Although the first embodiment employs the single-gate CMOSFET using a silicide gate electrode, the invention is also applicable to a case where no metal silicide is used. Although in the case of using no metal silicide, the delay time is slightly degraded, there can be provided a single-gate CMOSFET wherein the short-channel effect is restrained in a short-gate-length range of 0.2 μm or less. This CMOSFET will now be described along the manufacturing process. The manufacturing method of the second embodiment is also applicable to the CMOSFET of the first embodiment except for the process step of forming a metal silicide film.

FIGS. 23A to 23E are sectional views, showing, in a stepwise manner, the method for manufacturing a semiconductor device according to the second embodiment of the invention. As is shown in FIG. 23G, the finished product does not employ a metal silicide film.

With reference first to FIG. 23A, a semiconductor substrate 200 made of silicon, etc. is prepared, and element-separating insulation films 201 for surrounding element regions wherein a p-MOSFET and an n-MOSFET are formed are provided by the LOCOS method, etc.

Subsequently, a p-well 202 is formed by introducing, by the ion injection method, etc., a p-type impurity such as boron into the n-MOSFET region of the substrate 200. Similarly, an n-well 203 is formed by introducing, by the ion injection method, etc., an n-type impurity such as arsenic, phosphorus, etc., into the p-MOSFET region of the substrate 200.

Thereafter, as is shown in FIG. 23B, an oxide film 204 with a thickness of about 12 nm is formed on the p-MOSFET region of the substrate 200 by thermal oxidation, etc.

Then, as is shown in FIG. 23C, an n-type impurity such as As is injected into an upper portion of the n-well 203 in the p-MOSFET region through the oxide film 204, under the conditions, for example, that the dose is $(1 \times 10^{13} \text{ cm}^{-2})$ and the injection energy is 140 keV. Thus, a low-concentration n-type layer 205 is formed. The n-type impurity concentration of the n-type layer 205 is set higher than that of the n-well 203 within a range of $6 \times 10^{17}$ to $2 \times 10^{18}$ cm$^{-3}$.

Then, as is shown in FIG. 23D, to form the p-type buried channel layer 206 of the p-MOSFET, a p-type impurity such as B is injected into a surface portion of the n-type layer 205 by ion injection with, for example, an injection energy of 15 keV and a dose of $4 \times 10^{13}$ cm$^{-2}$. As a result, the impurity peak concentration of the p-type buried layer is $4 \times 10^{18}$ cm$^{-3}$ or more.

Figure 23E:
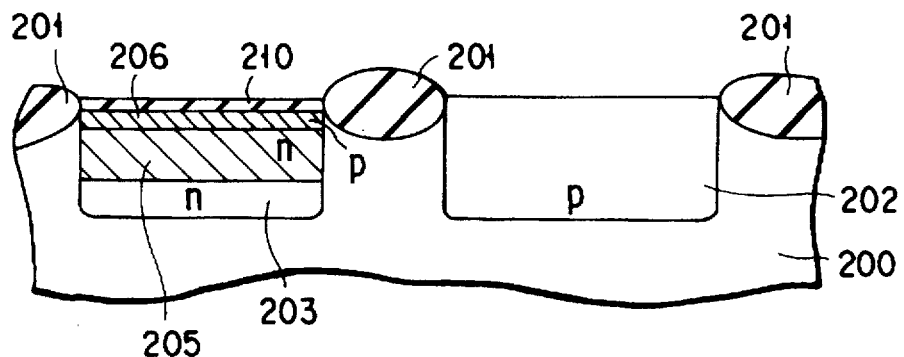

Subsequently, as is shown in FIG. 23E, the oxide film 204 is removed by a treatment using hydrofluoric acid, etc., and the resultant structure is again thermally oxidized, thereby forming an oxide film 210 which will serve as a gate oxide film. In the invention, the thickness of the gate oxide film is preferably set to 6 nm or less, and more preferably to 3 to 5 nm.

Figure 23F:
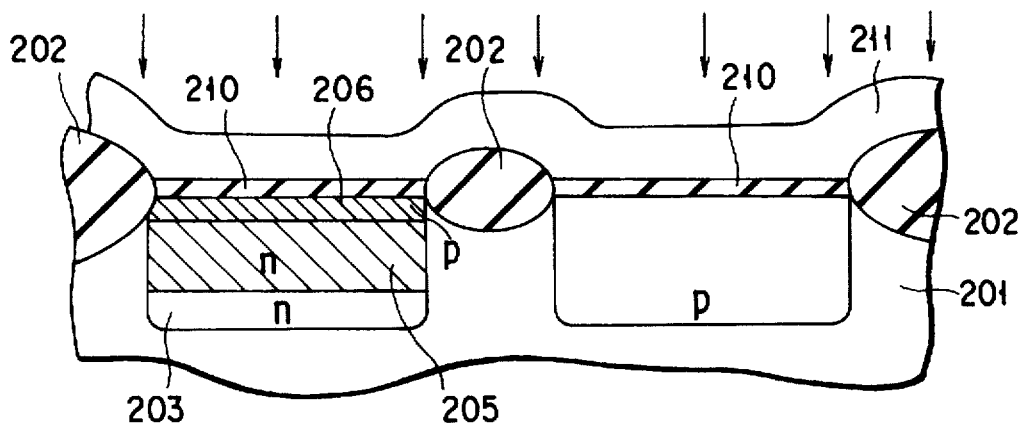
Figure 23G:
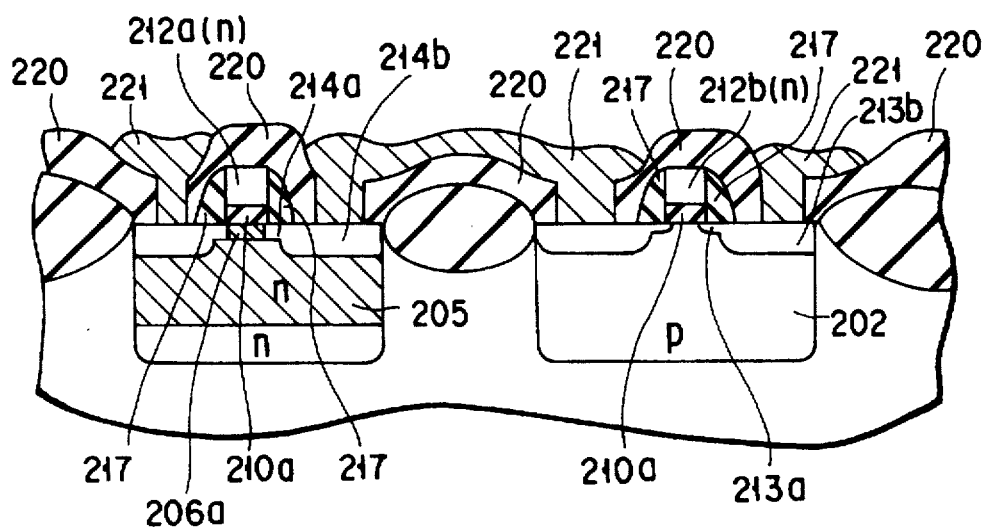

As is shown in FIG. 23F, a polycrystalline silicon film 211 which will serve as an electrode is formed on the overall surface of the resultant structure by the LPCVD (Low Pressure Chemical Vapour Deposition), etc.

Thereafter, an n-type impurity such as P, As, etc. is added by ion injection, etc. into those portions of the polycrystalline silicon film 211 which will serve as the gate electrodes of the n-MOSFET and p-MOSFET. The addition of the n-type impurity may be performed while the polycrystalline silicon film 211 is deposited.

Then, as is shown in FIG. 23G, the polycrystalline silicon film 211 and the oxide film 210 are etched by the RIE (Reactive Ion Etching), etc. using an etching mask pattern (not shown). As a result, gate electrodes 212a and 212b made of the n-type polycrystalline silicon film and a gate oxide film 210a are formed.

Then, a shallow and low-concentration p-type LDD region 214a is selectively formed on the n-type layer 205 by injecting a p-type impurity such as B, In, etc. using the gate electrode 212a of the p-MOSFET as a mask. Subsequently, a shallow and low-concentration n-type LDD region 213a is selectively formed on the p-well 202 by injecting an n-type impurity such as As, P, etc. using the gate electrode 212b of the n-MOSFET as a mask.

At this time, each pair of the source/drain regions can be selectively formed by masking, with a resist or the like, that one of the MOSFETs which is not subjected to ion injection. Moreover, the ions injected to form the buried channel are activated for several—100 seconds using a halogen lamp with a wavelength of 0.4 to 4.0 µm, at the same time when the source/drain regions are activated, thereby obtaining the impurity profile of the buried channel shown in FIG. 1.

The final concentration profiles of the buried region and source/drain region are determined in a heat treatment performed after ion injection. Since lamp annealing is considered a preferable heat treatment, it is employed in the embodiment. Further, it is preferable to do the heat treatment for impurity activation at a time and for a short period.

As is shown in FIG. 23G, after gate side wall insulating films 217 are formed, ion injection is performed using, as masks, the gate side wall insulating films 217 and the gate electrodes 212, thereby forming p-type source/drain regions 214b and an n-type source/drain regions 213b in the p-MOSFET region and n-MOSFET region, respectively. The source/drain regions 213b and 214b are formed deeper and higher in concentration than the LDD regions 213a and 214a, respectively.

Lastly, as is also shown in FIG. 23G, an interlayer insulating film 220 is formed on the overall resultant structure, then contact holes are formed in the source/drain regions, respectively, and wires 221 made of aluminum Al, etc. are formed in the holes, thereby completing a CMOSFET of a single-gate structure.

The invention is not limited to the above-described embodiments. For example, in the embodiments, the n-type and p-type regions or impurities may be replaced with each other. Furthermore, although in the embodiments, the invention is applied to inverters, it is also applicable to an AND circuit, an OR circuit, etc.

In the above-described embodiments, TiSi$_2$ and CoSi$_2$ are used for a titanium silicide and a cobalt silicide, respectively. Although TiSi, Co$_2$Si and CoSi can be used as well, it is preferable to use TiSi$_2$ or CoSi$_2$ for a metal silicide.

As described above in detail, a second-conductivity type buried region is shallowly formed in a first-conductivity type semiconductor region located just below the first-conductivity type gate electrode of a first-channel type MOSFET. Therefore, the single-gate CMOSFET of the invention has a slight variance of its threshold voltage and operate at high speed even where it is more fined.

FIG. 24 is a graph, showing the relationship between the gate length and the delay time of each stage of inverters which employ single-gate and dual-gate CMOSFETs with Co silicide gate electrodes. In the case of the dual-gate structure, it has been confirmed that the delay time is shortened with the trend indicated by line A even in the short-gate-length range. In the case of the single-gate structure, in a gate-length range of 0.2 µm or more, a delay time trend as indicated by line B' is known in the conventional case. On the other hand, it was confirmed that the invention enables a higher speed operation than ever with a delay time trend indicated by line B in a gate-length range of 0.2 µm or less.

It should be noted that the operational speed obtained by the dual-gate structure when the gate length is 0.1 µm can be obtained by the invention when the gate length is 0.15 µm. In other words, the use of the single-gate CMOSFET of the invention enables a lithography technique for a gate length of more than 0.1 µm to achieve substantially the same speed operation as a dual-gate CMOSFET with the gate length of 0.1 µm. As a result, the cost of the CMOSFET can be reduced.

FIG. 25 is a graph, showing the relationship between the gate length and the delay time of each stage of inverters which employ single-gate and dual-gate CMOSFETs with Ti silicide gate electrodes. In the case of the dual-gate structure, it is known that the structure has a delay time trend as shown in line C, which indicates that the delay time increases when the gate length is shorter than 0.15 µm. In the case of the single-gate structure, in the gate-length range of 0.2 µm or more, a delay time trend as indicated by line D' is known in the conventional case. On the other hand, the invention enables a higher speed operation than ever with a delay time trend indicated by line D in the gate-length range of 0.2 μm or less. Also in the case of using a titanium silicide film, a higher speed operation which cannot be expected by the conventional technique can be achieved by the invention.

Figure 26:
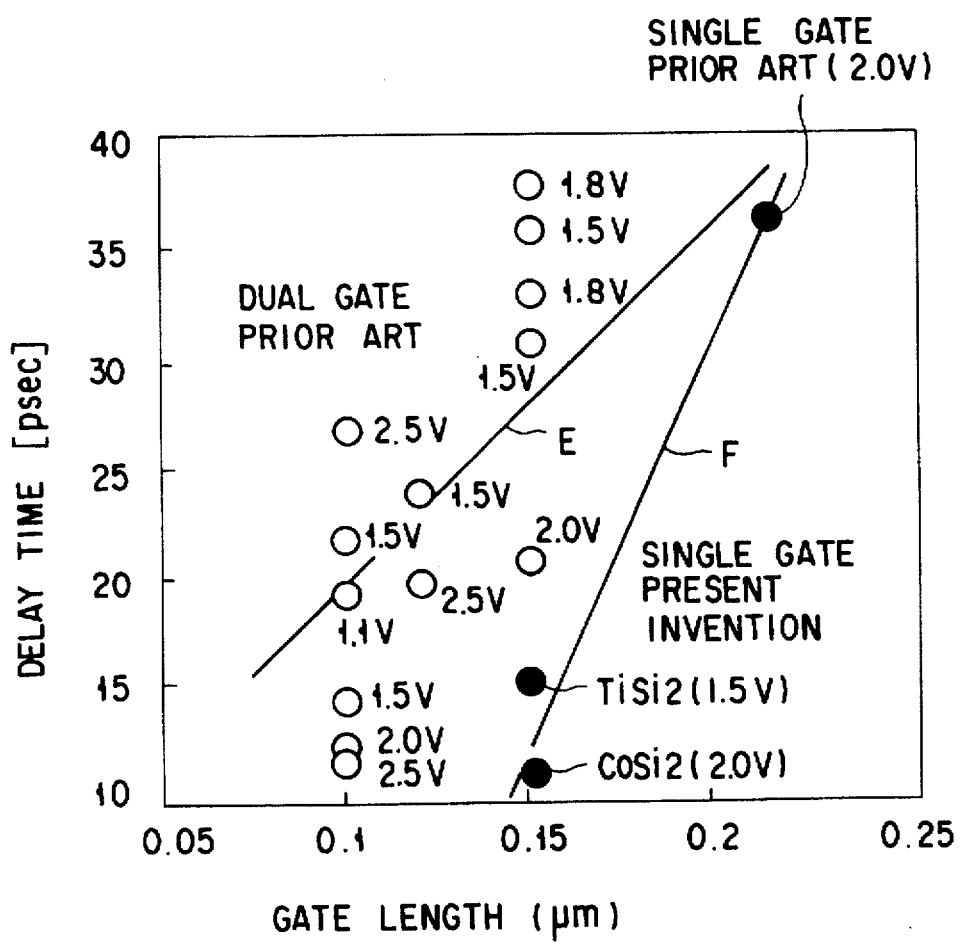
FIG. 26 is a schematic graph, useful in explaining that the trend of increasing the speed of operation in the conventional CMOS inverter differs from that in the present invention.

FIG. 26 is a graph, showing the general relationship between the gate length and the delay time of the conventional structure and the invention in a short-gate-length range. It is understood from FIG. 26 that the invention can perform a high-speed operation with a delay time trend as indicated by line F, which cannot be expected by the conventional technique with a delay time trend as indicated by line E.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a semiconductor substrate having a major surface;

a first semiconductor region of a first conductivity type selectively formed on the major surface of the semiconductor substrate;

a second semiconductor region of a second conductivity type formed on the major surface of the semiconductor substrate and electrically isolated from the first semiconductor region; and a CMOSFET including a first channel type MOSFET formed in the first semiconductor region and a second channel type MOSFET formed in the second semiconductor region;

wherein:

the first channel type MOSFET has a first gate insulating film formed on a predetermined portion of the first semiconductor region, a first gate electrode formed on the first gate insulating film, made of a first conductivity type semiconductor and having a gate length of 0.2 μm or less, first source/drain regions of the second conductivity type respectively formed in the first semiconductor region along both sides of the first gate electrode and respectively including a first lightly doped region adjacent to the gate electrode and a first heavily doped region which is adjacent to and thicker than the first lightly doped region, and a buried channel region of the second conductivity type formed in the first semiconductor region just below the first gate electrode; and the second channel type MOSFET has a second gate insulating film formed on a predetermined portion of the second semiconductor region, a second gate electrode formed on the second gate insulating film, made of the first conductivity type semiconductor and having a gate length of 0.2 μm or less, and second source/drain regions of the first conductivity type respectively formed in the second semiconductor region along both sides of the second gate electrode and respectively including a second lightly doped region adjacent to the gate electrode and a second heavily doped region which is adjacent to and thicker than the second lightly doped region.

2. The semiconductor device according to claim 1, wherein the first channel type MOSFET and the second channel type MOSFET are formed of a p-channel type MOSFET and an n-channel type MOSFET, respectively, and the first and the second gate electrode is formed of n-type polycrystalline silicon.

3. The semiconductor device according to claim 1, wherein the first semiconductor region has a peak impurity concentration falling within a range of from $2 \times 10^{17}$ cm$^{-3}$ to $2 \times 10^{18}$ cm$^{-3}$, and the buried channel region has a peak impurity concentration not less than $2 \times 10^{18}$ cm$^{-3}$ and also higher than the peak impurity concentration of the first semiconductor region.

4. The semiconductor device according to claim 3, wherein the peak impurity concentration of the buried channel region is higher than the peak impurity concentration of the first semiconductor region and is lower than ten times of the same first semiconductor region.

5. The semiconductor device according to claim 1, wherein the junction between the buried channel region and the first semiconductor region is formed at a level of 0.8 μm or less below the surface of the semiconductor substrate.

6. The semiconductor device according to claim 1, wherein the buried channel region has a peak carrier concentration at a level of 0.5 μm or less below the surface of the semiconductor substrate.

7. The semiconductor device according to claim 1, wherein the first and the second gate insulating film has a thickness of 6 nm or less.

8. A semiconductor device comprising:

a semiconductor substrate having a major surface;

a first semiconductor region of a first conductivity type selectively formed on the major surface of the semiconductor substrate;

a second semiconductor region of a second conductivity type formed on the major surface of the semiconductor substrate and electrically isolated from the first semiconductor region; and a CMOSFET including a first channel type MOSFET formed in the first semiconductor region and a second channel type MOSFET formed in the second semiconductor region;

wherein;

the first channel type MOSFET has a first gate insulating film formed on a predetermined portion of the first semiconductor region, a first gate electrode formed on the first gate insulating film, made of a first conductivity type semiconductor and having a gate length of 0.4 μm or less, a first alloy layer formed on the first gate electrode and made of the first conductivity type semiconductor and cobalt, first source/drain regions of the second conductivity type respectively formed in the first semiconductor region along both sides of the first gate electrode and respectively including a first lightly doped region adjacent to the gate electrode and a first heavily doped region which is adjacent to and thicker than the first lightly doped region, and a buried channel region of the second conductivity type formed in the first semiconductor region just below the first gate electrode; and the second channel type MOSFET has a second gate insulating film formed on a predetermined portion of the second semiconductor region, a second gate electrode formed on the second gate insulating film, made of the first conductivity type semiconductor and having a gate length of 0.4 μm or less, a second alloy layer formed on the second gate electrode and made of the first conductivity type semiconductor and cobalt, and second source/drain regions of the first conductivity type respectively formed in the second semiconductor region along both sides of the second gate electrode and respectively including a second lightly doped region adjacent to the gate electrode and a second heavily doped region which is adjacent to and thicker than the second lightly doped region.

9. The semiconductor device according to claim 8, wherein the first channel type MOSFET and the second channel type MOSFET are formed of a p-channel type MOSFET and an n-channel type MOSFET, respectively, the first and the second gate electrode is formed of n-type polycrystalline silicon, and the first and the second alloy layer is formed of cobalt silicide film.

10. The semiconductor device according to claim 8, wherein the first semiconductor region has a peak impurity concentration falling within a range of from $2\times10^{17}$ cm$^{-3}$ to $2\times10^{18}$ cm$^{-3}$, and the buried channel region has a peak impurity concentration not less than $2\times10^{18}$ cm$^{-3}$ and also higher than the peak impurity concentration of the first semiconductor region.

11. The semiconductor device according to claim 10, wherein the peak impurity concentration of the buried channel region is higher than the peak impurity concentration of the first semiconductor region and is lower than ten times of the impurity concentration of the first semiconductor same.

12. The semiconductor device according to claim 8, wherein the junction between the buried channel region and the first semiconductor region is formed at a level of 0.8 μm or less below the surface of the semiconductor substrate.

13. The semiconductor device according to claim 8, wherein the buried channel region has a peak carrier concentration at a level of 0.05 μm or less below the surface of the semiconductor substrate.

14. The semiconductor device according to claim 8, wherein the first and the second gate insulating film has a thickness of 6 nm or less.

15. A semiconductor device comprising:

a semiconductor substrate having a major surface;

a first semiconductor region of a first conductivity type selectively formed on the major surface of the semiconductor substrate;

a second semiconductor region of a second conductivity type formed on the major surface of the semiconductor substrate and electrically isolated from the first semiconductor region; and a CMOSFET including a first channel type MOSFET formed in the first semiconductor region and a second channel type MOSFET formed in the second semiconductor region;

wherein:

the first channel type MOSFET has a first gate insulating film formed on a predetermined portion of the first semiconductor region, a first gate electrode formed on the first gate insulating film, made of a first conductivity type semiconductor and having a gate length of 0.2 μm or less, a first alloy layer formed on the first gate electrode and made of the first conductivity type semiconductor and titanium, first source/drain regions of the second conductivity type respectively formed in the first semiconductor region along both sides of the first gate electrode and respectively including a first lightly doped region adjacent to the gate electrode and a first heavily doped region which is adjacent to and thicker than the first lightly doped region, and a buried channel region of the second conductivity type formed in the first semiconductor region just below the first gate electrode; and the second channel type MOSFET has a second gate insulating film formed on a predetermined portion of the second semiconductor region, a second gate electrode formed on the second gate insulating film, made of the first conductivity type semiconductor and having a gate length of 0.2 μm or less, a second alloy layer formed on the second gate electrode and made of the first conductivity type and titanium, and second source/drain regions of the first conductivity type respectively formed in the second semiconductor region along both sides of the second gate electrode and respectively including a second lightly doped region adjacent to the gate electrode and a second heavily doped region which is adjacent to and thicker than the second lightly doped region.

16. The semiconductor device according to claim 15, wherein the first channel type MOSFET and the second channel type MOSFET are formed of a p-channel type MOSFET and an n-channel type MOSFET, respectively, the first and the second gate electrode is formed of n-type polycrystalline silicon, and the first and the second alloy layer is formed of titanium silicide film.

17. The semiconductor device according to claim 15, wherein the first semiconductor region has a peak impurity concentration falling within a range of from $2\times10^{17}$ cm$^{-3}$ to $2\times10^{18}$ cm$^{-3}$, and the buried channel region has a peak impurity concentration not less than $2\times10^{18}$ cm$^{-3}$ and also higher than the peak impurity concentration of the first semiconductor region.

18. The semiconductor device according to claim 17, wherein the peak impurity concentration of the buried channel region is higher than the peak impurity concentration of the first semiconductor region and is lower than ten times of the impurity concentration of the first semiconductor same.

19. The semiconductor device according to claim 15, wherein the junction between the buried channel region and the first semiconductor region is formed at a level of 0.8 μm or less below the surface of the semiconductor substrate.

20. The semiconductor device according to claim 15, wherein the buried channel region has a peak carrier concentration at a level of 0.05 μm or less below the surface of the semiconductor substrate.

* * * * *

UNITED STATES PATENT AND TRADEMARK OFFICE
CERTIFICATE OF CORRECTION

PATENT NO. : 5,736,767
DATED : April 7, 1998
INVENTOR(S) : Takashi YOSHITOMI, et al.

It is certified that error appears in the above-identified patent and that said Letters Patent is hereby corrected as shown below:

On the title page, item [54], and on top of column 1, the last word of the title should be added as shown below:

--[54]  .......STRUCTURE--

Signed and Sealed this

Twenty-third Day of June, 1998

Attest:

BRUCE LEHMAN

Attesting Officer

Commissioner of Patents and Trademarks